United States Patent
Kamikawa et al.

(10) Patent No.: US 6,532,975 B1
(45) Date of Patent: Mar. 18, 2003

(54) SUBSTRATE PROCESSING APPARATUS AND SUBSTRATE PROCESSING METHOD

(75) Inventors: Yuji Kamikawa, Koshi-Machi (JP); Kouji Egashira, Tosu (JP); Koji Tanaka, Saga (JP)

(73) Assignee: Tokyo Electron Limited (JP)

( * ) Notice: Subject to any disclaimer, the term of this patent is extended or adjusted under 35 U.S.C. 154(b) by 197 days.

(21) Appl. No.: 09/635,465

(22) Filed: Aug. 11, 2000

(30) Foreign Application Priority Data

Aug. 13, 1999 (JP) ............................................ 11-229319
Nov. 16, 1999 (JP) ............................................ 11-326084

(51) Int. Cl.[7] .......................... B08B 3/00; B05C 13/02
(52) U.S. Cl. ........................ 134/61; 134/140; 134/902; 118/500; 414/589; 414/938
(58) Field of Search ............................ 134/61, 64, 140, 134/143, 902; 118/500, 501; 414/222.01, 222.07, 589, 935, 938

(56) References Cited

U.S. PATENT DOCUMENTS

| | | | | |
|---|---|---|---|---|
| 4,524,719 A | * | 6/1985 | Campbell et al. | 118/719 |
| 5,232,328 A | | 8/1993 | Owczarz et al. | 414/222 |
| 5,370,142 A | * | 12/1994 | Nishi et al. | 118/500 |
| 5,660,517 A | * | 8/1997 | Thompson et al. | 414/217 |
| 5,678,320 A | | 10/1997 | Thompson et al. | 34/58 |
| 5,784,797 A | | 7/1998 | Curtis et al. | 34/58 |
| 6,068,002 A | * | 5/2000 | Kamikawa et al. | 134/102.3 |
| 6,158,449 A | * | 12/2000 | Kamikawa | 134/140 |
| 6,171,403 B1 | * | 1/2001 | Kamikawa et al. | 134/133 |
| 6,299,696 B2 | * | 10/2001 | Kamikawa et al. | 134/19 |

FOREIGN PATENT DOCUMENTS

JP     06-112186     4/1994

* cited by examiner

Primary Examiner—Randy Gulakowski
Assistant Examiner—Joseph L. Perrin
(74) Attorney, Agent, or Firm—Smith, Gambrell & Russell LLP

(57) ABSTRACT

An outer covering wall (26) and an inner covering wall (27), which are capable of surrounding a rotor (24), can be horizontally moved. A wafer carrier waiting portion (30) is disposed right below the rotor (24). A wafer holding member (41) included in a water lifter (40) moves into a wafer carrier (C) containing wafers (W) and mounted on a stage (31) (sliding table 32) included in the wafer carrier waiting portion (30), lifts up the wafers (W) and transfers the wafers (W) to the rotor (24). The outer covering wall (26) or the inner covering wall (27) surrounds the rotor (24) to define a processing chamber. The wafers (W) held on the rotor (24) are subjected to a cleaning process in the processing chamber.

20 Claims, 30 Drawing Sheets

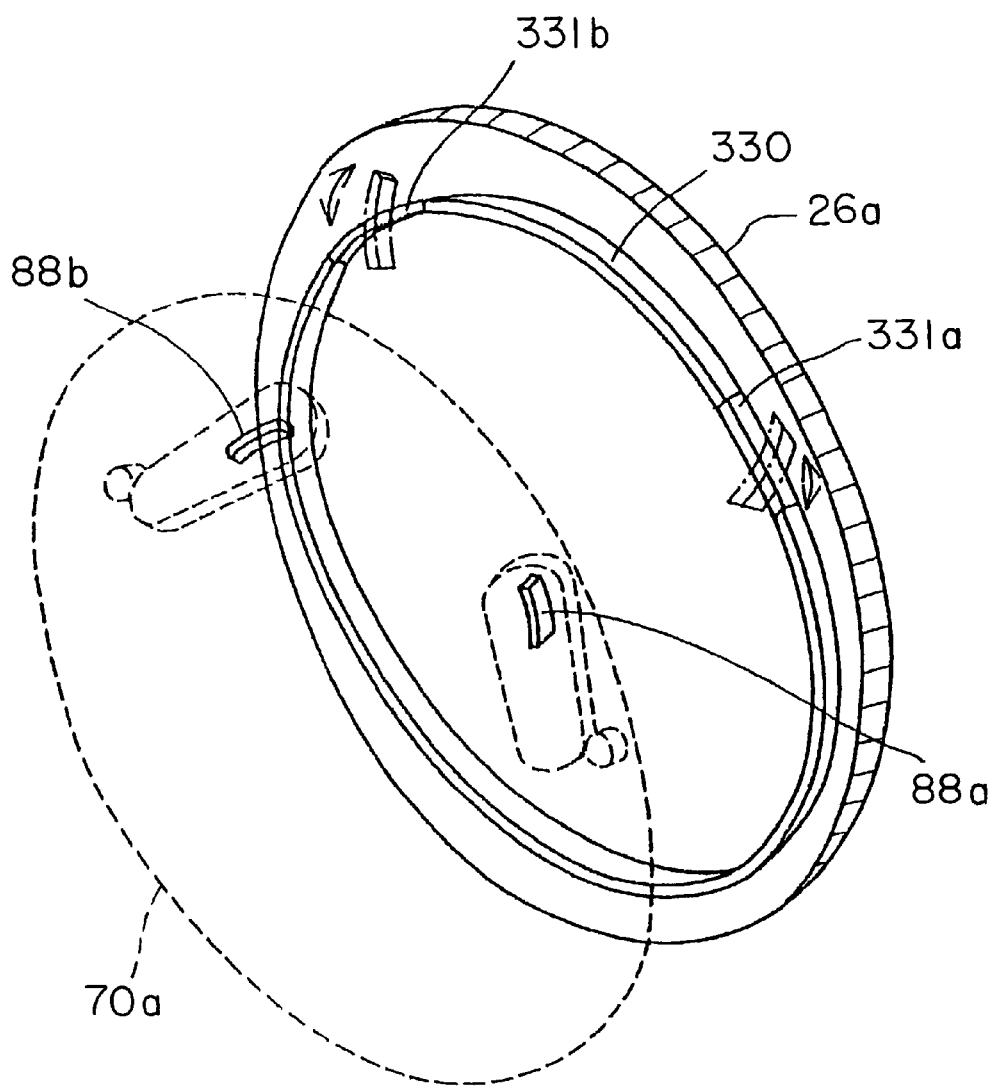
FIG. IIA

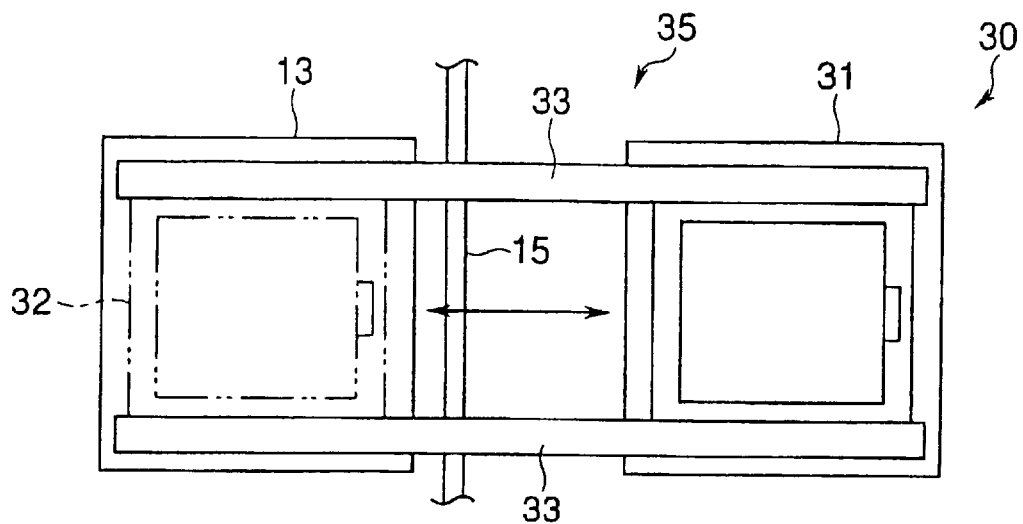
F I G. 12 (a)
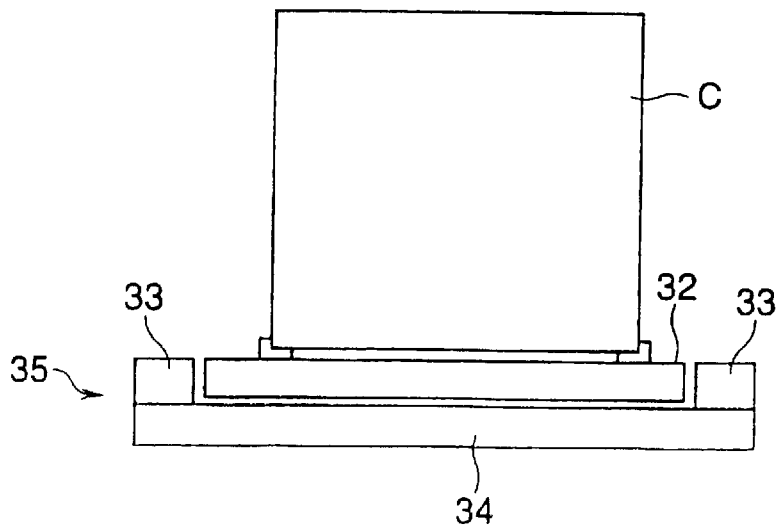
F I G. 12 (b)

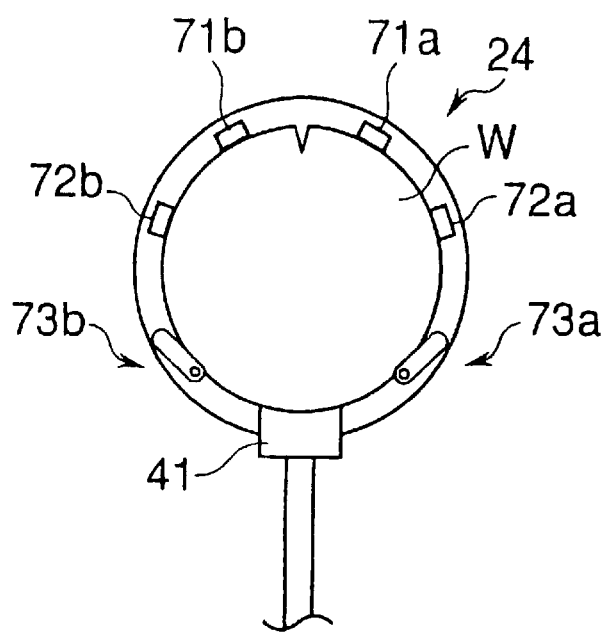
F I G. 17
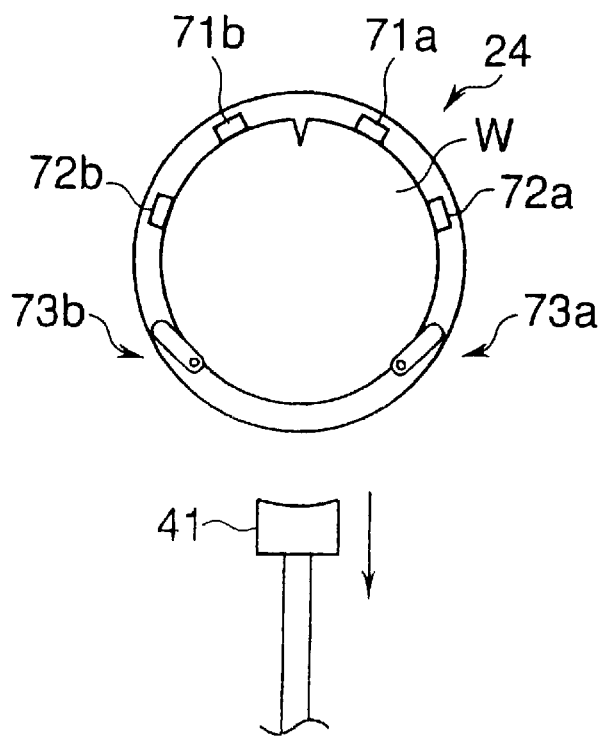
F I G. 18

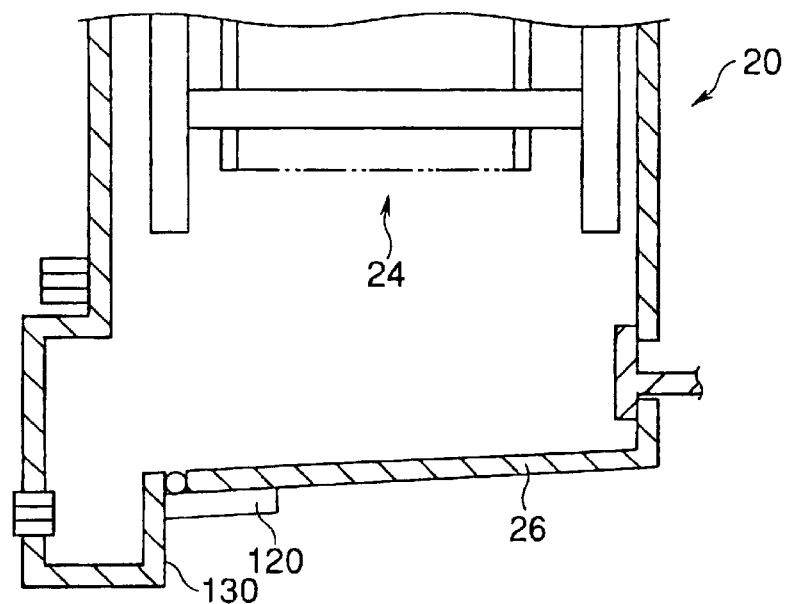
F I G. 19
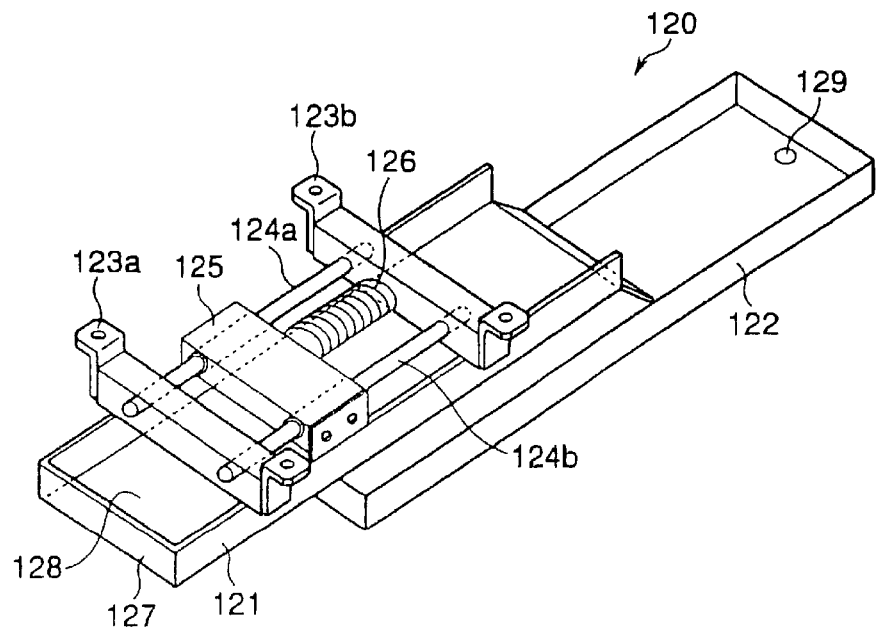
F I G. 20

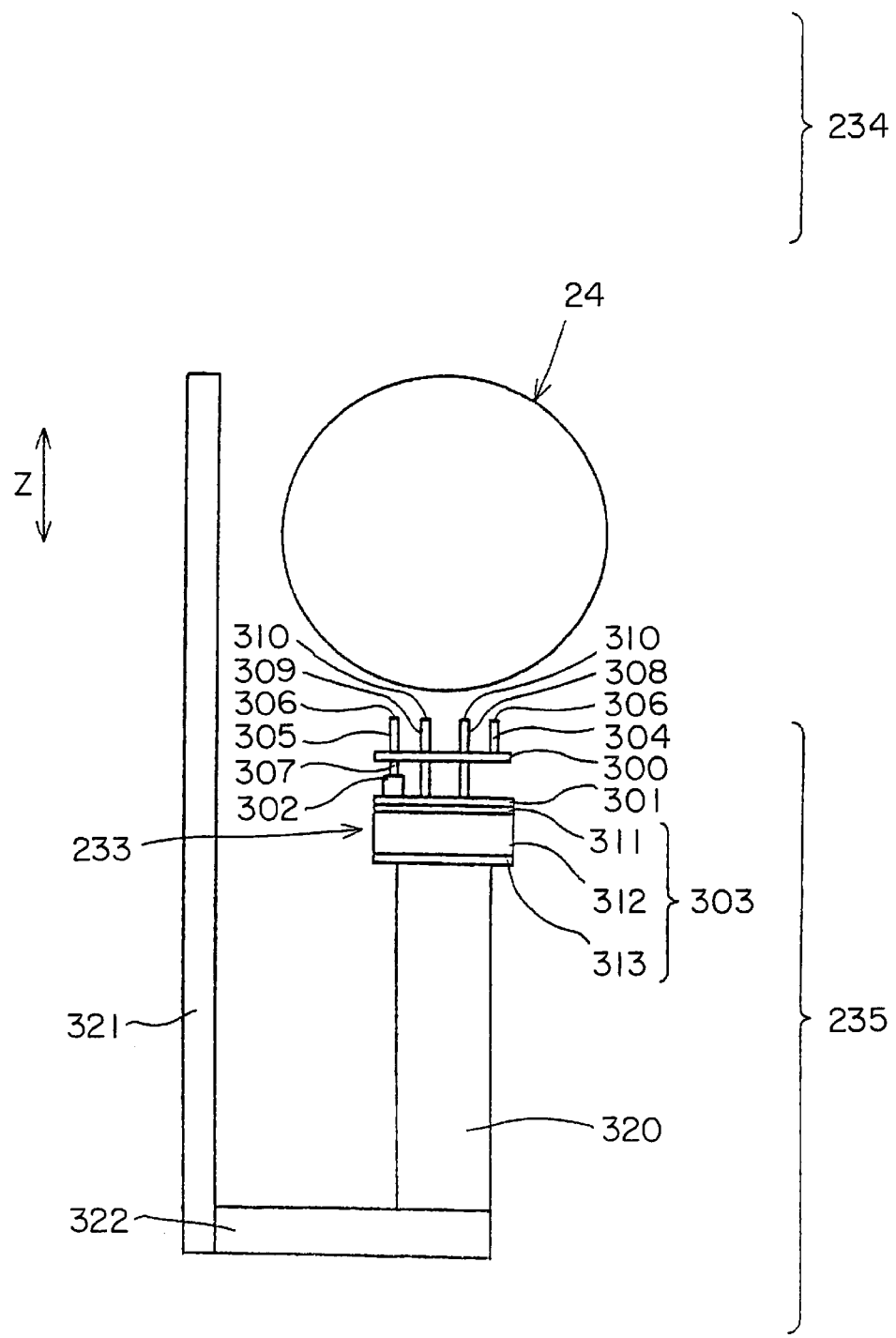
F I G. 25

SUBSTRATE PROCESSING APPARATUS AND SUBSTRATE PROCESSING METHOD

BACKGROUND OF THE INVENTION

1. Field of the Invention

The present invention relates to a substrate processing apparatus for processing substrates, such as semiconductor wafers, by a predetermined process and a substrate processing method.

2. Description of the Related Art

A semiconductor device fabricating process employs a wafer cleaning apparatus that cleans semiconductor wafers, i.e., substrates, with a cleaning liquid, such as pure water or a desired chemical liquid, to clean the wafers of contaminants including organic contaminants and metallic impurities, and a wafer drying apparatus that removes liquid drops from wafers for drying by means of an inert gas, such as $N_2$ gas, or a highly volatile and hydrophilic IPA vapor. Each of those known wafer cleaning apparatus and wafer drying apparatus is of a batch processing type that processes a plurality of semiconductor wafers simultaneously in a wafer cleaning chamber or a wafer drying chamber.

Batch-type wafer cleaning apparatus are disclosed in, for example, U.S. Pat. Nos. 5,784,797, 5,678,320 and 5,232,328. The batch-type wafer cleaning apparatus has a wafer carrying device that carries semiconductor wafers into a water cleaning chamber formed therein. Generally, the wafer carrying device has a wafer chuck including a pair of gripping members. The wafer chuck grips a plurality of semiconductor wafers collectively. A lateral rotor is supported for rotation in the wafer cleaning chamber. The plurality of semiconductor wafers carried into the wafer cleaning chamber by the wafer carrying device are held by holding members mounted on the rotor in the wafer cleaning chamber. More concretely, in the wafer cleaning apparatus disclosed in U.S. Pat. Nos. 5,784,797 and 5,678,320, the wafer chuck of a wafer carrying device is moved through a doorway formed in a front wall of a wafer cleaning chamber (a wall facing the wafer carrying device moving toward a wafer cleaning chamber) into the wafer cleaning chamber from a side in front of a wafer cleaning tank (from a side in front of the rotor), and wafers are transferred from the wafer chuck to the rotor.

A known wafer cleaning apparatus 400 shown in FIG. 32 has a wafer cleaning tank 402 defining a wafer cleaning chamber 401. A rotor 405 capable of holding semiconductor wafers W and of rotating can be moved through an opening 403 formed in the front end of the cleaning tank 402 into and out of the cleaning tank 402. With the rotor 405 disposed outside the wafer cleaning tank 402, the semiconductor wafers W are transferred between the rotor 405 and a chuck having gripping members 409a and 409b and attached to a carrying device. The rotor 405 is moved into and out of the cleaning tank 402 and is rotated by a driving mechanism 407. A shaft 480 is connected to the rotor 405.

A batch-type wafer drying apparatus is disclosed in, for example, JP-A No. Hei 6-112186. This prior art batch-type wafer drying apparatus has a wafer cleaning tank defining a wafer drying chamber and having an upper wall provided with a doorway. A lateral rotor is disposed in the wafer cleaning chamber. A wafer holding hand capable of vertical movement for handling semiconductor wafers is detachably mounted on the rotor. The wafer holding hand is raised through the doorway to a position above the wafer cleaning tank to transfer semiconductor wafers between the wafer holding hand and a wafer carrying device. When drying semiconductor wafers by this batch-type wafer drying apparatus, the semiconductor wafers are transferred from the wafer carrying device to the wafer holding hand and the wafer holding hand is lowered to place the wafers in the wafer drying chamber. Subsequently, the wafer holding hand holding the semiconductor wafers is mounted on the rotor to load the rotor with the wafers, and the wafers are dried. After the wafers have been dried, the wafer holding hand is separated from the rotor, is raised to a position above the wafer drying tank, and the dried wafers are griped by the wafer carrying device.

The wafer cleaning apparatus disclosed in U.S. Pat. No. 5,784,797 and 5,678,320 need to secure a space sufficient for the wafer chuck to operate in the wafer cleaning chamber and hence the size of the wafer cleaning chamber must be increased accordingly. Since the wafer chuck operates in a limited space in the wafer chamber, the operation of the wafer chuck must be carefully controlled so that the wafer chuck may not collide against the wall of the wafer cleaning tank. Consequently, the wafer carrying deice must execute complicated operations and a control program for controlling the wafer carrying device is inevitably complicated.

Although the wafer chuck of the wafer cleaning apparatus 400 shown in FIG. 39 does not need to operate in a limited space, the wafer chuck must be controlled so that the gripping members 409a and 409b of the wafer chuck may not collide against the holding members 406 of the rotor 405. Consequently, a complicated control program is necessary for controlling the wafer chuck and the rotor 405.

In the wafer drying apparatus disclosed in JP-A No. Hei 6-112186, the wafer holding hand is always in contact with the semiconductor wafers throughout a period in which the wafers are carried into the drying chamber, dried and carried out of the drying chamber. Therefore, there is the possibility that particles and the like adhering to and remaining on the wafer holding hand adhere again to the wafers to contaminate the dried wafers.

SUMMARY OF THE INVENTION

Accordingly, it is an object of the present invention to provide a substrate processing apparatus having a small substrate processing chamber and facilitating work for carrying substrates into and out of the substrate processing chamber, and a substrate processing method. Another object of the present invention is to provide a substrate processing apparatus and a substrate processing method capable of preventing the contamination of substrates.

To achieve the objects, the present invention provides a substrate processing apparatus including: a substrate processing portion at which a plurality of substrates are treated by a process; a substrate waiting portion at which the substrates stand by for the process, the waiting portion being arranged below the processing portion; and a substrate lifter including a substrate supporting member configured to support the substrates from below the substrates, the supporting member being capable of vertical movement, wherein the lifter supports the substrates placed at the waiting portion and raises the substrates thereby moves the substrates from the waiting portion to the processing portion, and wherein the lifter supports the substrates placed in the processing portion and lowers the substrates thereby moves the substrates from the processing portion to the waiting portion.

The present invention also provides substrate processing apparatus including: a substrate processing portion at which a plurality of substrates are treated by a process; a substrate waiting portion at which the substrates stand by for the process, the waiting portion being arranged above the processing portion; and a substrate lifter including a substrate supporting member configured to support the substrates from below the substrates, the supporting member being capable of vertical movement, wherein the lifter supports the substrates placed at the waiting portion and lowers the substrates thereby moves the substrates from the waiting portion to the processing portion, and wherein the lifter supports the substrates placed in the processing portion and raises the substrates thereby moves the substrates from the processing portion to the waiting portion, and wherein the lifter is disposed outside of the processing portion.

According to another respect of the present invention, a substrate processing method is provided, the method including the steps of: carrying a substrate container containing a plurality of substrates into a container waiting portion disposed below a substrate processing portion for processing substrates; supporting the substrates contained in the substrate container, and raising the substrate to the processing portion disposed above the waiting portion; treating the substrates by a process at the substrate processing portion; supporting the substrates which have been treated and lowering the substrates into a substrate container; and carrying out the substrate container containing the processed substrates, which have been treated, from the waiting portion.

The present invention also provides a substrate processing method including the steps of: holding a plurality of substrates by an arm and carrying a substrates into a substrate waiting portion disposed above a substrate processing portion; delivering the substrates from the arm to a supporting member; lowering the supporting member thereby moving the substrates to the processing portion; holding the substrates by a substrate holding device provided at the processing portion; further lowering the supporting member thereby withdrawing the supporting member from the processing portion; and treating the substrates by a process at the substrate processing portion.

BRIEF DESCRIPTION OF THE DRAWINGS

FIG. 11A is a perspective view of another mechanism alternative to that shown in FIGS. 9 to 11;

FIG. 12 is a plan view and a front elevation of a wafer container carrier for carrying a wafer container between a stage included in a loading/unloading unit, and a wafer container waiting portion included in the cleaning unit;

FIGS. 15 to 18 are typical views of assistance in explaining operations of the wafer lifter for moving wafers to the rotor;

FIG. 19 is a sectional view of an outer covering member provided with a drip preventing device;

FIG. 20 is a perspective view of the drip preventing device shown in FIG. 19;

FIG. 25 is a schematic front elevation of an essential portion of the cleaning unit shown in FIG. 24;

DESCRIPTION OF THE PREFERRED EMBODIMENTS

A wafer cleaning apparatus in a first embodiment according to the present invention will be described with reference to FIGS. 1 to 20. The wafer cleaning apparatus carries out all the operations for carrying, cleaning, drying and delivering semiconductor wafers in a batch processing apparatus.

Figure 1:
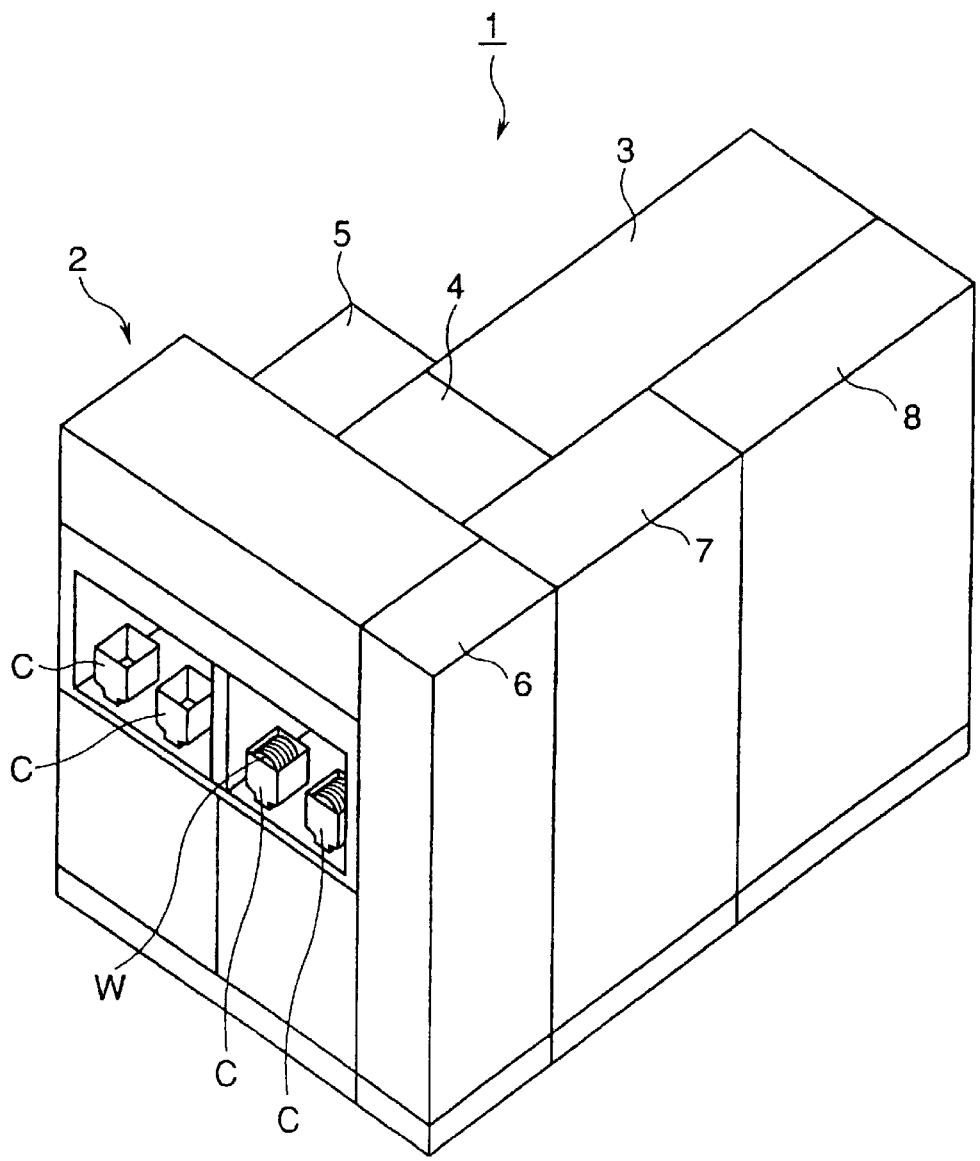
FIG. 1 is a perspective view of a wafer cleaning apparatus in a first embodiment according to the present invention.
Figure 2:
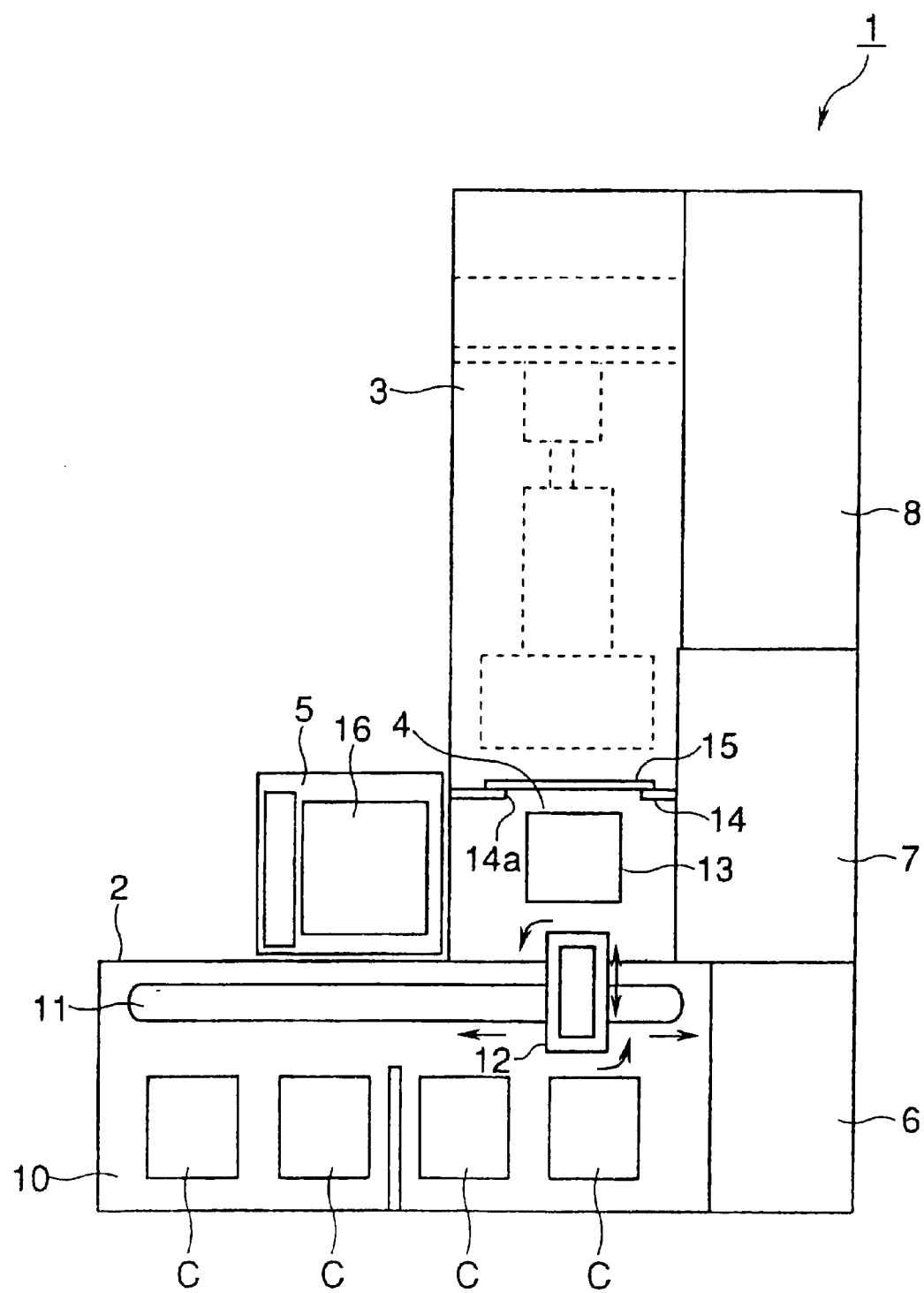
FIG. 2 is a schematic plan view of the wafer cleaning apparatus shown in FIG. 1.

Referring to FIGS. 1 and 2, the wafer cleaning apparatus 1 has a container receiving/delivering unit 2, i.e., so-called "in/out port", for receiving and delivering a wafer carrier C or a container containing wafers W, a cleaning unit 3 for cleaning wafers W, a loading/unloading unit 4 interposed between the in/out port 2 and the cleaning unit 3 to carry a wafer carrier C into and out of the cleaning unit 3, a wafer carrier cleaning unit 5 for cleaning wafer carriers C, and a wafer carrier storage unit 6 for storing a plurality of wafer carriers C. The wafer cleaning apparatus 1 has also a power unit 7 and a chemical liquid tank box 8.

The in/out port 2 is provided with a stage 10 capable of supporting four wafer carriers C thereon. A carrying path 11 is formed in the in/out port 2 on the stage 10 along a line on which wafer carriers C are arranged. A wafer carrier carrying mechanism 12 moves along the carrying path 11 to carry a wafer carrier C placed on the stage 10 to the loading/unloading unit 4 and to carry a wafer carrier C from the loading/unloading unit 4 onto the stage 10. A wafer carrier C is capable of containing, for example, twenty-six wafers in a vertical position in a horizontal arrangement.

The loading/unloading unit 4 has a stage 13 for supporting a wafer carrier C thereon. A wafer carrier C transferred from the in/out port 2 onto the stage 13 is carried by the wafer carrier carrying mechanism 12, which will be described in detail later, into the cleaning unit 3. The wafer carrier carrying mechanism 12 carries the wafer carrier C from the cleaning unit 3 onto the stage 13. Since a wafer carrier C is carried from the stage 10 to the stage 13 by turning an arm included in the wafer carrier carrying mechanism 12, the wafer carrier C placed on the stage 13 faces a direction opposite a direction in which the wafer carrier C faces on the stage 10. Therefore, the direction in which the wafer carrier C faces on the stage 13 is reversed by a reversing mechanism, not shown.

The cleaning unit 3 and the loading/unloading unit 4 are separated by a partition wall 14 provided with an opening 14a through which a wafer carrier C is moved between the cleaning unit 3 and the loading/unloading unit 4. The opening 14a can be closed by a shutter 15. The shutter 15 is closed while the cleaning unit 3 is in operation. The shutter 15 is opened when carrying a wafer carrier C from the loading/unloading unit 4 into the cleaning unit 3 and when carrying a wafer carrier C from the cleaning unit 3 to the loading/unloading unit 4.

The wafer carrier cleaning unit 5 has a wafer carrier cleaning tank 16 to clean an empty wafer carrier C which has been emptied by unloading wafers W therefrom in the cleaning unit 3.

In the wafer carrier storage unit 6, empty wafer carriers C emptied by unloading wafers W to be cleaned therefrom are stored temporarily and empty wafer carriers C are stored therein to receive cleaned wafers W. A plurality of wafer carriers C can be stored in stacks. The wafer carrier storage unit 6 is provided with a wafer carrier moving mechanism for transporting a desired one of the plurality of wafer carriers C stored in the wafer carrier storage unit 6 to the stage 10 and for placing wafer carriers C at desired positions in the wafer carrier storage unit 6 for storage.

The cleaning unit 3 will be described with reference to FIGS. 3 to 6.

Figure 3:
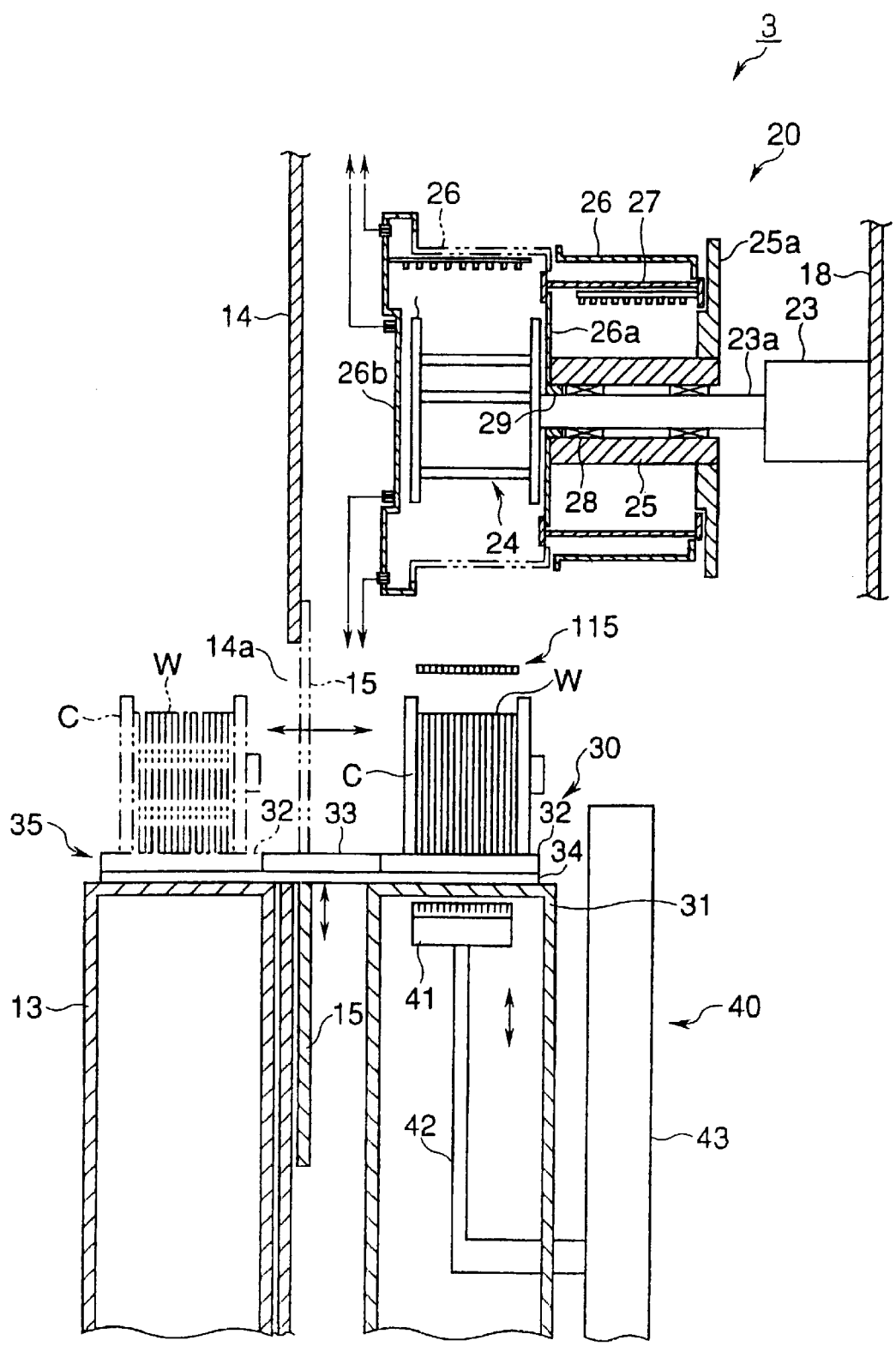
FIG. 3 is a sectional view of a cleaning unit included in the wafer cleaning apparatus shown in FIG. 2.

Referring to FIG. 3, the cleaning unit 3 is provided therein with a substrate cleaning portion (i.e., a substrate processing portion) and a substrate carrier waiting portion 30 (i.e., a substrate waiting portion). A cleaning device 20 is provided at the cleaning portion. The waiting portion 30 is disposed right under the cleaning deice 20 to keep a wafer carrier C temporarily. Furthermore, a wafer lifter 40 (i.e. so-called "wafer hand") is provided in the cleaning unit 3. The wafer lifter 40 raises wafers W standing by for processing in a wafer carrier C at the waiting portion 30 to move the wafers W to the cleaning device 20. The wafer lifter 40 also returns the wafers W from the cleaning device 20 to the wafer carrier C kept at the waiting portion 30.

The cleaning device 20 removes a resist mask and an etch residue, such as fragments of a polymer layer, remaining on wafers W processed by an etching process. The cleaning device 20 includes a vertical support wall 18, a motor 23 having a drive shaft 23a and fixedly held on the support wall 18 in a horizontal position, a rotor 24 connected to the drive shaft 23a of the motor 23, a cylindrical support tube 25 surrounding the drive shaft 23a of the motor 23, a cylindrical outer covering wall 26 supported on the support tube 25, and a cylindrical inner covering wall 27.

Figure 4:
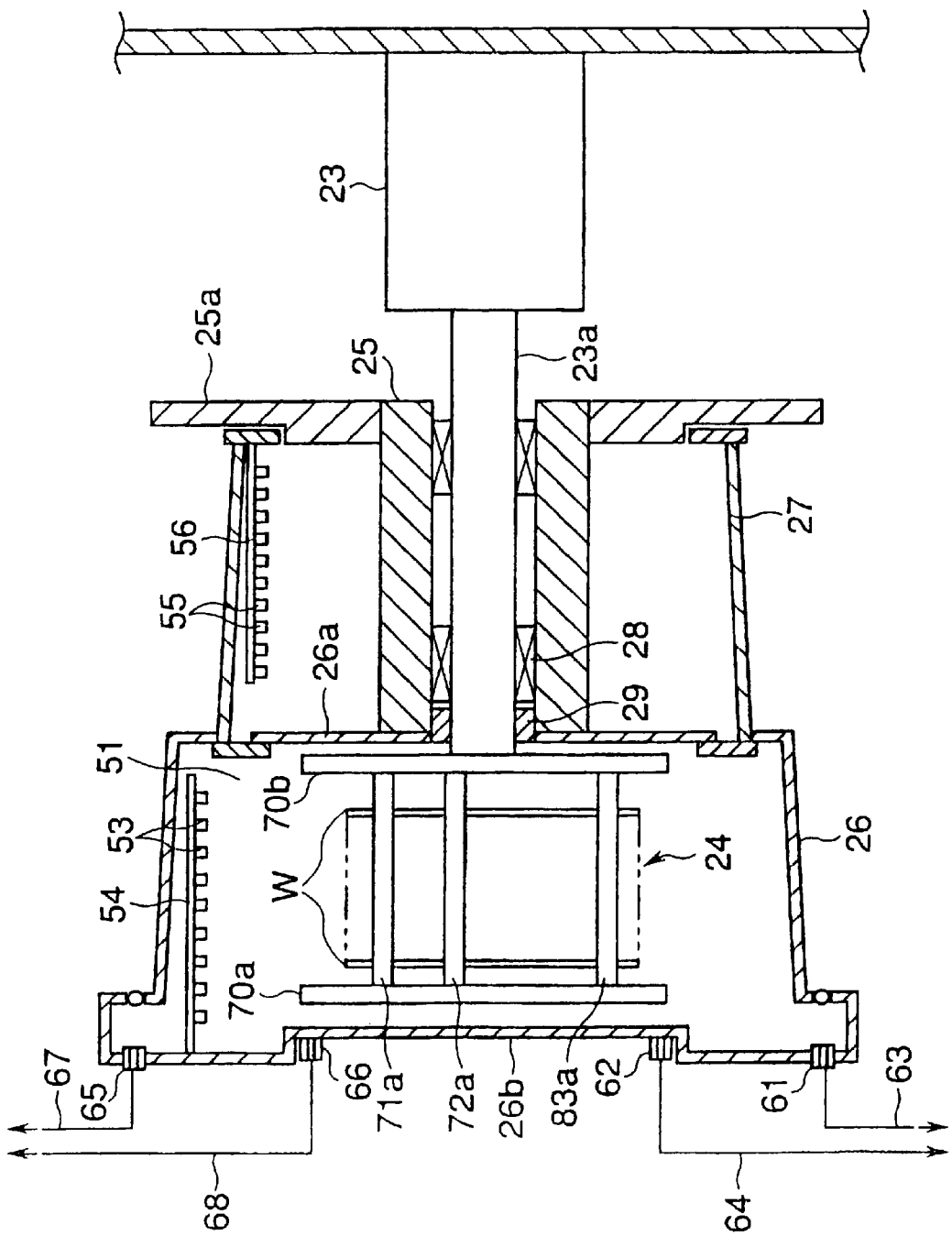
FIG. 4 is a sectional view of a cleaning device included in the cleaning unit, in which an inner covering member is placed outside an outer covering member.
Figure 5:
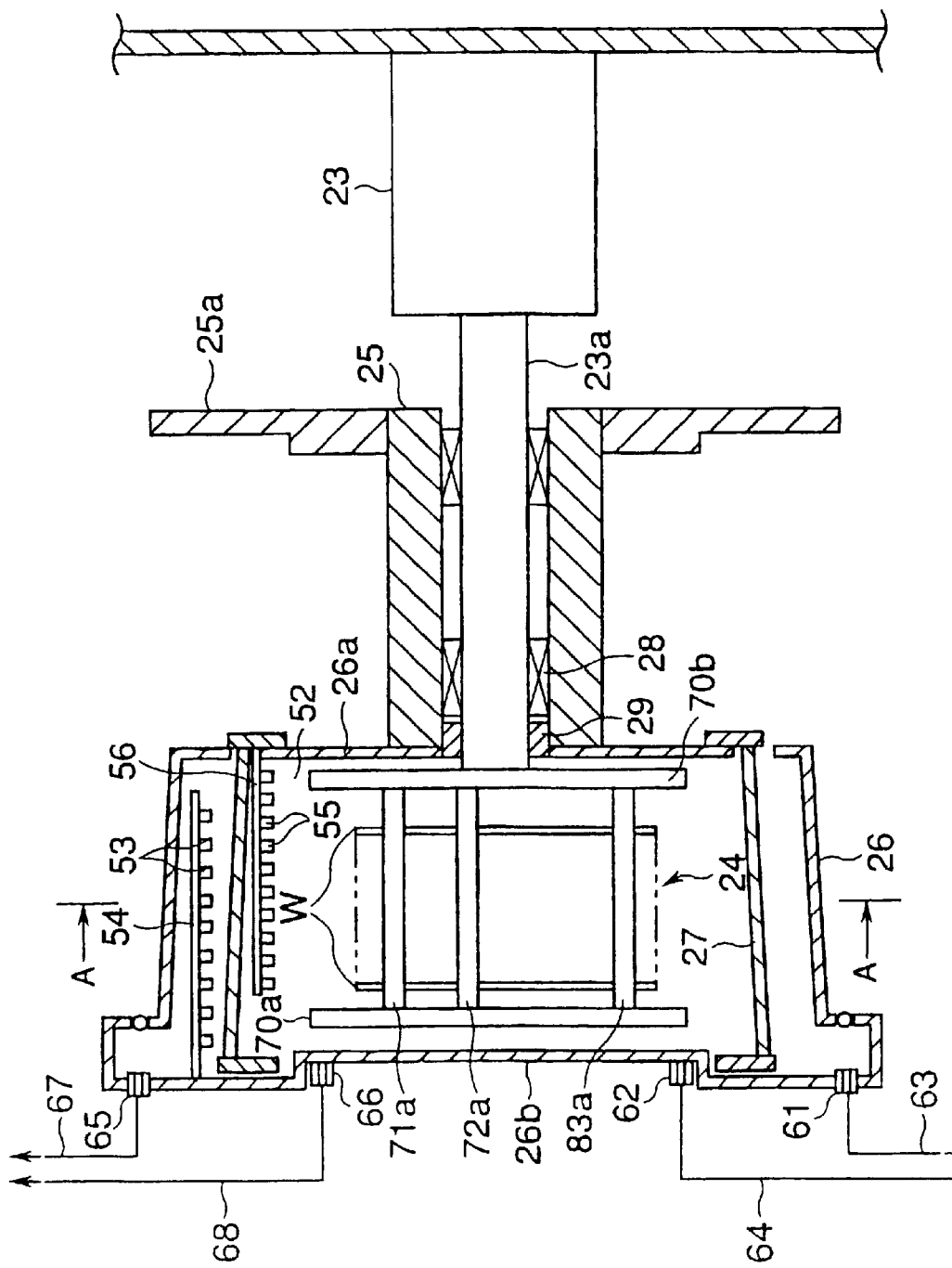
FIG. 5 is a sectional view of the cleaning device of the cleaning unit, in which the inner covering member is placed inside the outer covering member.

The outer covering wall 26 can be horizontally moved between a working position indicated by two-dot chain lines in FIG. 3 around the rotor 24 and a back position indicated by continuous lines in FIG. 3 around the support tube 25. The inner covering wall 27 has a diameter smaller than that of the outer cover wall 26. The inner covering wall 27 can be horizontally moved between a working position around the rotor 24 as shown in FIG. 5 and a back position around the support tube 25 as shown in FIGS. 3 and 4. When wafers W are carried into and carried out of the rotor 24, the outer covering wall 26 and the inner covering wall 27 are held at their back positions as shown in FIG. 3. When the outer covering wall 26 is at the working position and the inner covering wall 27 is at the back position as shown in FIG. 4, a first chamber 51 (FIG. 4) is defined by the outer covering wall 26, a vertical wall 26a nearer to the motor 23 and a vertical wall 26b farther from the motor 23. When the inner covering wall 27 is at the working position as shown in FIG. 5, a second chamber 52 is defined by the inner covering wall 27 and the vertical walls 26a and 26b. The first chamber 51 and the second chamber 52 are sealed by sealing mechanisms in closed spaces.

The vertical wall 26a is attached to the support tube 25. The drive shaft 23a is supported in bearings 28 on the support tube 25. A labyrinth seal 29 is formed between the vertical wall 26a and an end part of the support tube 25 to prevent particles produced by the motor 23 from entering the chambers 51 and 52. A support member 25a is mounted on an end part of the support tube 25 on the side of the motor 23 to support the outer covering wall 26 and the inner covering wall 27.

Figure 6:
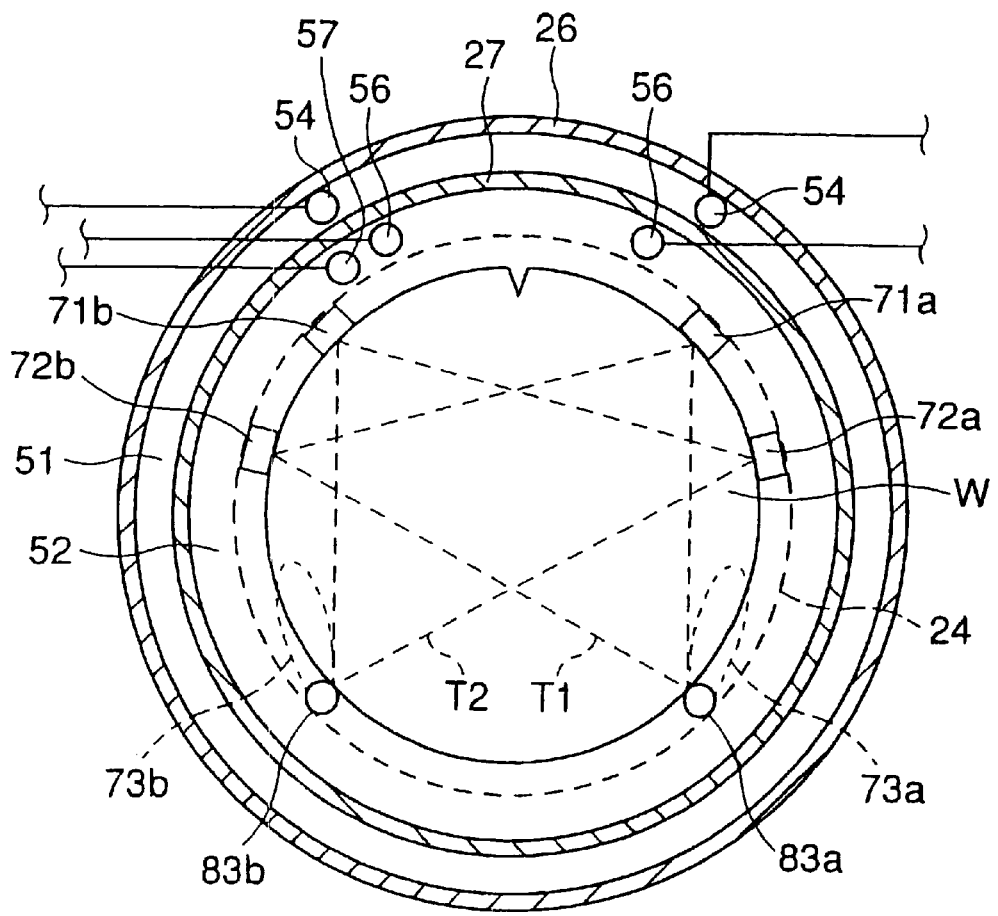
FIG. 6 is a sectional view taken on line A—A in FIG. 5.

As shown in FIGS. 4 to 6, two spray pipes 54 provided with a plurality of jetting holes 53 are attached in a horizontal position to an upper part of the vertical wall 26b opposite the vertical wall 26a with respect to the rotor 24. Pure water, IPA, $N_2$ gas or a chemical liquid supplied from a source, not shown, can be sprayed by the spray pipes 54. When the outer covering wall 26 is at the working position and the inner covering wall 27 is at the back position as shown in FIG. 4, the spray pipes 54 are in an upper position of the first chamber 51 as shown in FIG. 6.

Two spray pipes 56 provided with a plurality of jetting holes 55 are attached in a horizontal position to the inner covering wall 27. Pure water, IPA or a chemical liquid supplied from a source, not shown, can be sprayed by the spray pipes 56. As shown in FIG. 6, a $N_2$ gas jetting pipe 57 similar in construction to the spray pipes 56 is disposed near the spray pipe 56. When the outer covering wall 26 and the inner covering wall 27 are at their working positions as shown in FIG. 5, the spray pipes 54 extend in a space between the outer covering wall 26 and the inner covering wall 27, i.e., outside the second chamber 52, and the spray pipes 56 extend in an upper position of the second chamber 52.

A first drain port 61 is formed in a lower part of the vertical wall 26b to drain used pure water, a used chemical liquid or used IPA from the first chamber 51 in a state shown in FIG. 4. A second drain port 62 is formed in the vertical wall 26b at a position above the first drain port 61 to drain used pure water, a used chemical liquid or used IPA from the second chamber 52 in a state shown in FIG. 5. A first drain line 63 and a second drain line 64 are connected to the first drain port 61 and the second drain port 62, respectively.

A first discharge 65 is formed in an upper part of the vertical wall 26b to discharge a gas from the first chamber 51 in a state shown in FIG. 4. A second discharge port 66 is formed in the vertical wall 26b at a position below the first discharge port 65 to discharge a gas from the second chamber 52 in a state shown in FIG. 5. A first discharge line 67 and a second discharge line 68 are connected to the first discharge port 65 and the second discharge port 66, respectively.

Figure 7:
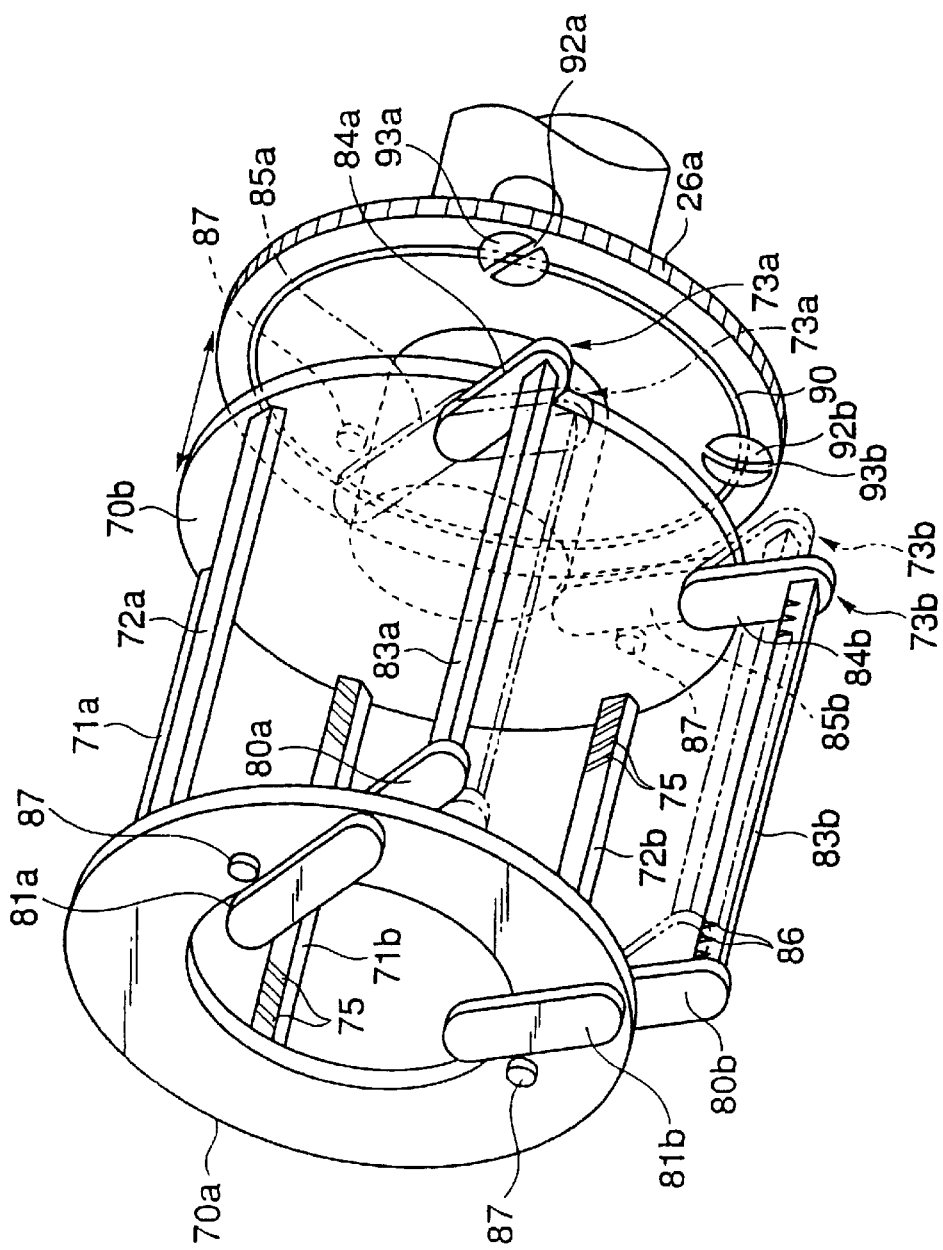
FIG. 7 is a perspective view of a rotor included in the cleaning device.

The rotor 24 is capable of holding, for example, twenty-six wafers W in a horizontal arrangement. As shown in FIG. 7, the rotor 24 has a pair of disks 70a and 70b, first holding members 71a and 71b extended between the pair of disks 70a and 70b so as to be symmetrical with respect to a vertical plane including the axis of the rotor 24, second holding members 72a and 72b extended between the pair of disks 70a and 70b so as to be symmetrical with respect to a vertical plane including the axis of the rotor 24, and a pair of holding mechanisms 73a and 73b for fixedly holding wafers W on the rotor 24.

The first holding members 71a and 72b and the second holding members 72a and 72b are provided with a plurality of grooves 75 for receiving peripheral parts of wafers W therein, respectively. At least one of the holding members 71a, 72b, 72a and 72b is provided with a pressure sensor.

Figure 8:
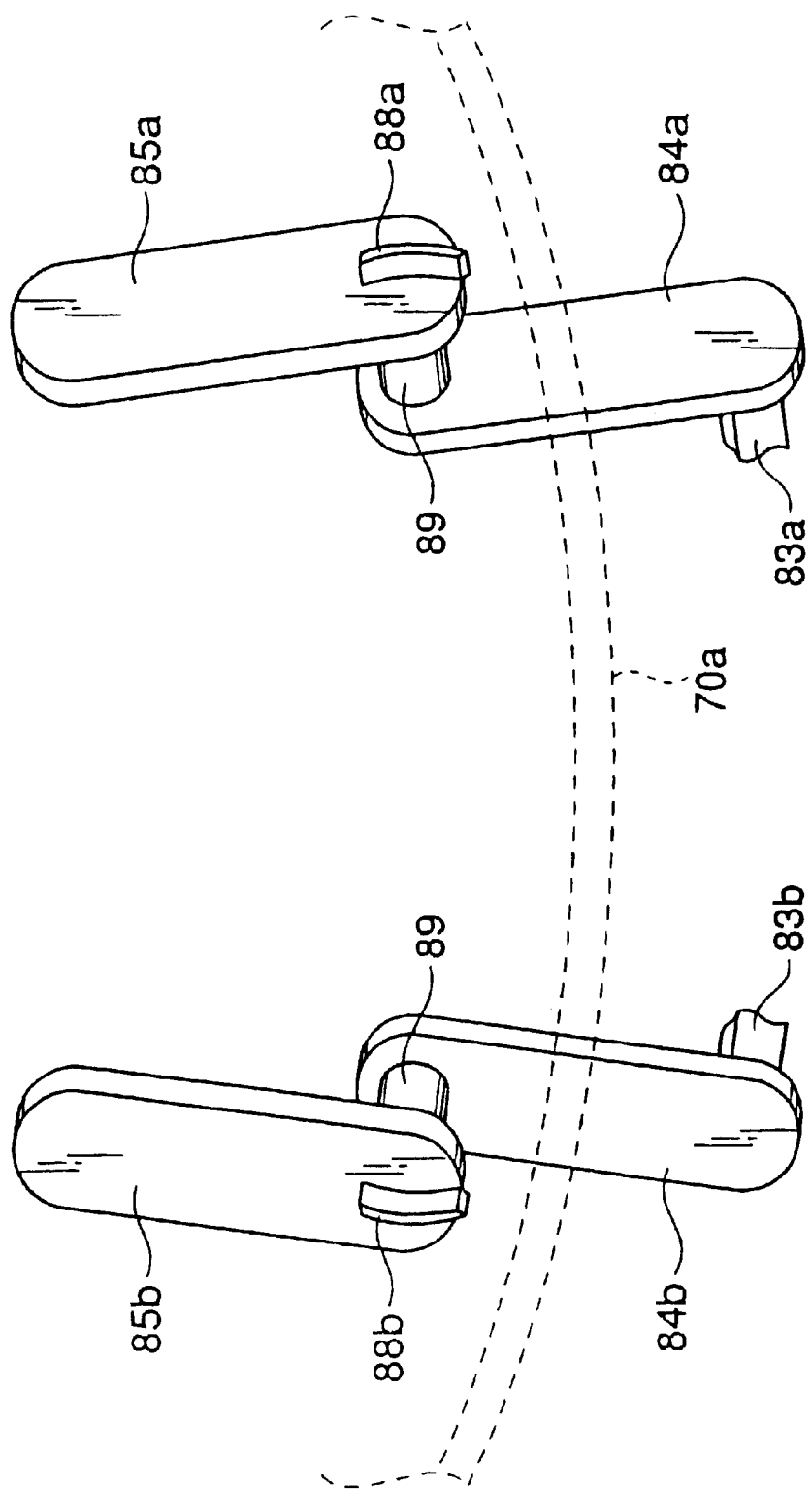
FIG. 8 is a perspective view of arms, balance weights and projections shown in FIG. 7.

As shown in FIGS. 7 and 8, the holding mechanism 73a includes an arm 80a disposed on the inner side of the disk 70a, a balance weight 81a dispose on the outer side of the disk 70a, an arm 84a disposed on the inner side of the disk 70b, a balance weight 85a disposed on the outer side of the disk 70b, and a third holding members 83a extended between the arms 80a and 84a. The arm 80a and the balance weight 81a are fixedly connected to the opposite ends, respectively, of a shaft 89 penetrating the disk 70a for simultaneous turning. The arm 84a and the balance weight 85a are fixedly connected to the opposite ends, respectively, of a shaft 89 penetrating the disk 70b for simultaneous turning. The holding mechanism 73b is similar in construction to the holding mechanism 73a. The holding mechanism 73b includes an arm 80b disposed on the inner side of the disk 70a, a balance weight 81b dispose on the outer side of the disk 70a, an arm 84b disposed on the inner side of the disk 70b, a balance weight 85b disposed on the outer side of the disk 70b, and a third holding member 83b extended between the arms 80b and 84b. The arm 80b and the balance weight 81b are fixedly connected to the opposite ends, respectively, of a shaft 89 penetrating the disk 70a for simultaneous turning. The arm 84b and the balance weight 85b are fixedly connected to the opposite ends, respectively, of a shaft 89 penetrating the disk 70b for simultaneous turning. The third holding members 83a and 83b of the holding mechanisms 73a and 73b are provided with a plurality of grooves 86 for receiving peripheral portions of wafers W therein.

Stopping pins 87 project from the outer surfaces of the disks 70a and 70b. When the third holding members 83a and 83b of the holding mechanisms 73a and 73b are turned toward wafer holding positions, respectively, the outward turning of the balance weights 81a, 81b, 85a and 85b is limited by the stopping pins 87 to prevent the balance weights 81a, 81b, 85a and 85b from turning excessively outward and from touching the covering wall. As shown in FIG. 8, the balance weight 85a and 85b supported on the disk 70b adjacent to the vertical wall 26a are provided with curved projections 88a and 88b, respectively.

Figure 9:
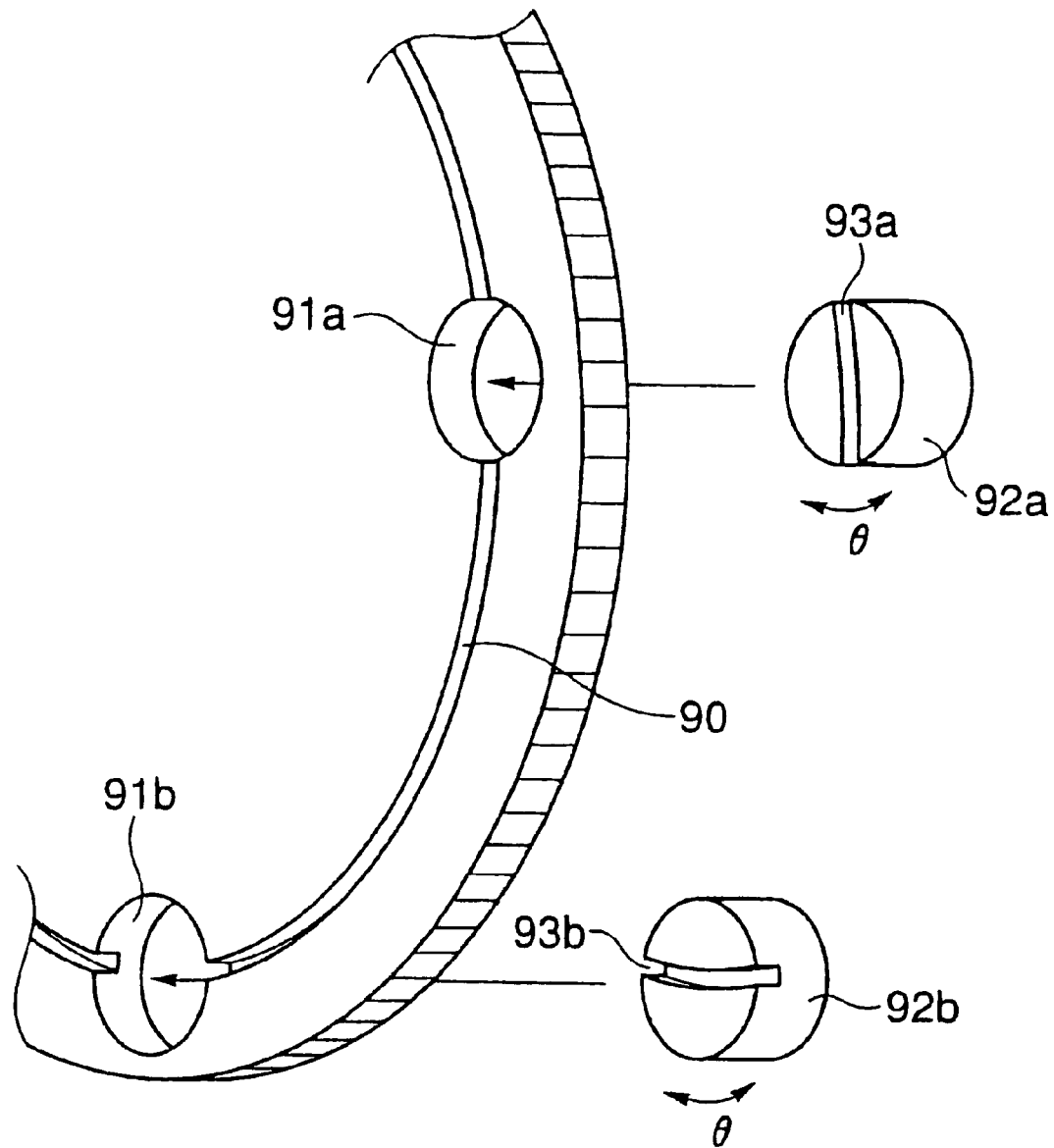
FIG. 9 is an enlarged perspective view of a vertical wall and condition selecting members shown in FIG. 7.
Figure 10:
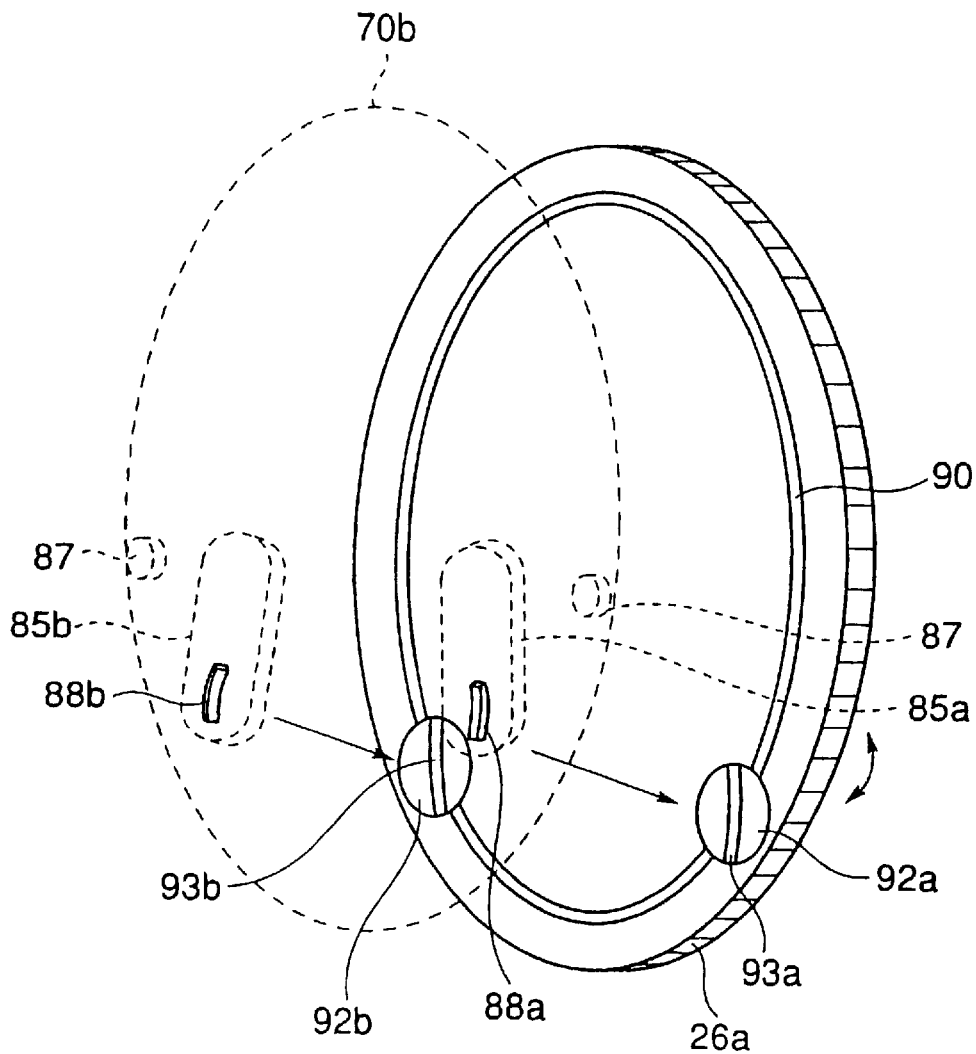
FIG. 10 is a perspective view of the condition selecting members and the projections in a state where a holding mechanism is in a releasing state.
Figure 11:
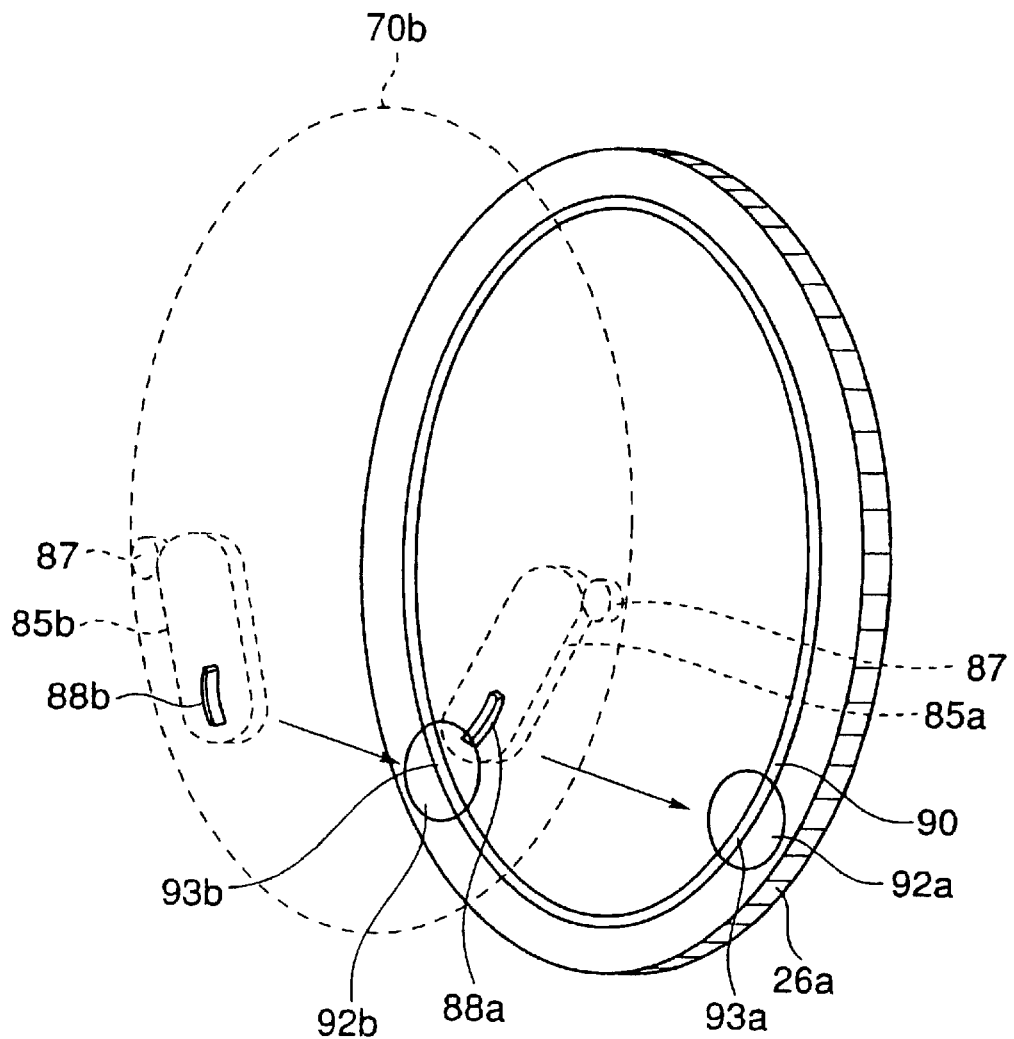
FIG. 11 is a perspective view of the condition selecting members and the projections in a state where the holding mechanism is in a holding state.

As shown in FIG. 9, an annular guide groove 90 is formed in the inner surface of the vertical wall 26a on the side of the motor 23. Circular openings 91a and 91b are formed in the vertical wall 26a at positions on the guide groove 90 and respectively corresponding to the holding mechanisms 73a and 73b, and cylindrical condition selecting members 92a and 92b are fitted in the circular openings 91a and 91b so as to be turnable in the directions of the arrows θ. Curved slots 93a and 93b having the shape of an arc of a circle corresponding to the annular guide groove 90 are formed in the front surfaces of the condition selecting members 92a and 92b, respectively. The condition selecting members 92a and 92b can be set in either an angular position in which the curved slots 93a and 93b form portions of the guide groove 90 as shown in FIG. 11 or an angular position in which the curved slots 93a and 93b extend across the guide groove 90 as shown in FIG. 10. The curved projections 88a and 88b of the balance weights 85a and 85b can be fitted in the curved slots 93a and 93b, respectively. The state of the holding mechanisms 73a and 73b can be selectively determined by the angular positions of the condition selecting members 92a and 92b.

When the condition selecting members 92a and 92b are set so that the curved slots 93a and 93b extend across the guide groove 90 as shown in FIG. 10 to set the balance weights 85a and 85b in a vertical position, the holding mechanisms 73a and 73b are set in a wafer releasing state indicated by continuous lines in FIG. 7.

When the condition selecting members 92a and 92b are set so that the curved slots 93a and 93b are continuous with the guide groove 90 as shown in FIG. 11, the balance weights 85a and 85b diverge upward, the holding mechanisms 73a and 73b are set in a wafer holding state indicated by two-dot chain lines in FIG. 7. In this state, the curved projections 88a and 88b of the balance weights 85a and 85b are able to move along the guide groove 90 and the curved slots 93a and 93b continuous with the guide groove 90, so that the rotor 24 is allowed to rotate. Since the condition of the holding mechanism 73a and 73b remains unchanged regardless of the angular position of the rotor 24, the wafers W are not released. Therefore, it is possible to prevent obstructing the supply of a cleaning liquid or a drying gas by wafers W projecting from the rotor 24 and to prevent damaging wafers W projecting from the rotor 24.

When the holding mechanisms 73a and 73b are in the wafer holding state, wafers W are held firmly by the first holding members 71a and 71b, the second holding members 72a and 72b and the third holding members 83a and 83b. As shown in FIG. 6, a triangle T1 formed by connecting points on the first holding member 71a, the second holding member 72b and the third holding member 83a at which each wafer W is held is an acute triangle, and a triangle T2 formed by connecting points on the first holding member 71b, the second holding member 72a and the third holding member 83b at which each wafer W is held is an acute triangle. Therefore, wafers W can be securely held on the rotor 24 during the rotation of the rotor 24.

FIG. 6 shows notched wafers W held on the rotor 24. When holding wafers W each provided with an orientation flat Wa indicated by a chain line as shown in FIG. 6 on the rotor 24, it is preferable to extend a support rod S indicated by a chain line in FIG. 6 between the disks 70a and 70b of the rotor 24. The support rod S in contact with the orientation flats Wa of the wafers W held on the rotor 24 prevents the unnecessary turning of the wafers W on the rotor 24 during the rotation of the rotor 24.

As shown in FIG. 11A, the vertical wall 26a may be provided on its inner surface with a circular guide rail 330 instead of the guide groove 90. The circular guide rail 330 is provided with two gaps, and two turnable rails 331a and 331b having the shape of an arc of a circle corresponding to the circular guide rail 330 are placed in the gaps instead of the condition selecting members 92a and 92b. The state of the holding mechanisms 73a and 73b can be selectively determined by selectively determining the angular positions of the rails 331a and 331b. When the rails 331a and 331b are set so as to be continuous with the guide rail 330, the holding mechanisms 73a and 73b are set in a water holding state and the rotor 24 is allowed to rotate.

Referring again to FIG. 3, the wafer carrier waiting portion 30 is provided with a stage 31. As shown in FIGS. 12(a) and 12(b), a wafer container carrier 35 or a carrier carrying mechanism, for carrying a wafer carrier C between the waiting portion 30 and the loading/unloading unit 4, includes a base 34 supported on the stages 13 and 31, two guide rails 33 laid on the base 34, and a sliding table 32 capable of moving along the guide rails 33 between the stage 13 of the loading/unloading unit 4 and the stage 31 of the waiting portion 30. The sliding table 32 is moved by a cylinder actuator, not shown, to move a wafer carrier C placed on the sliding table 32 between the stages 13 and 31.

The sliding table 32 is provided with an opening in a portion thereof corresponding to the wafer containing part of a wafer carrier C mounted thereon. The base 34 and the stage 31 are framed structures (skeletal structures). Therefore, a wafer supporting member 41 of the wafer lifter 40 is able to take out wafers W from and to put wafers W in a carrier C, which will be described later.

Figure 13:
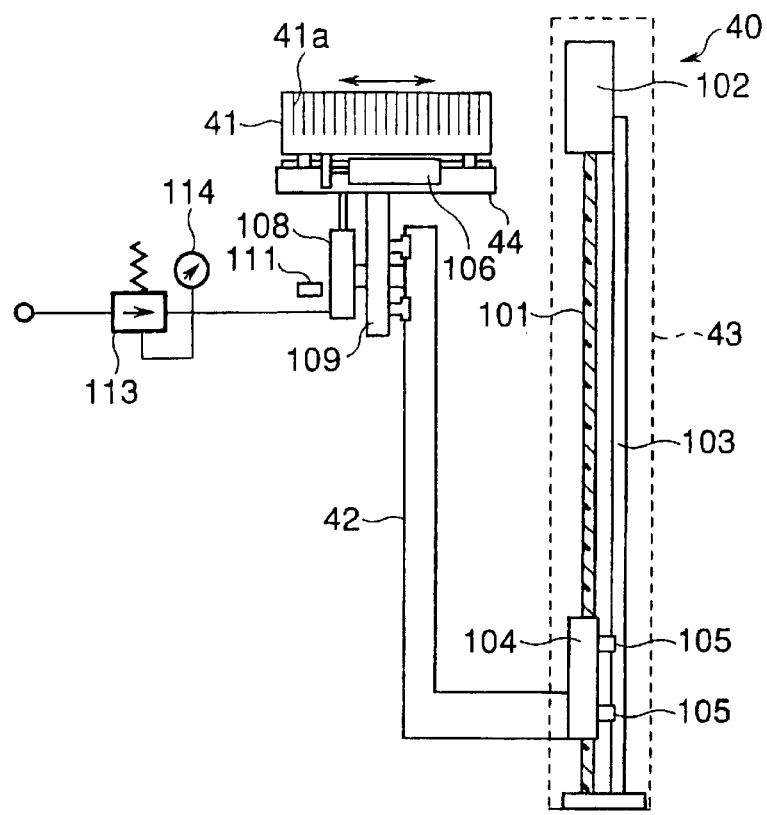
FIG. 13 is a side elevation of a wafer lifter included in the cleaning unit.
Figure 14:
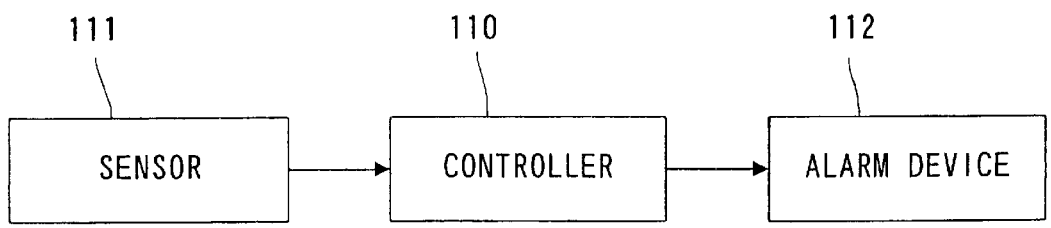
FIG. 14 is a block diagram of assistance in explaining an operation to be executed when a pressure exceeding a predetermined level is applied to wafers during the raising operation of the wafer lifter.

Referring to FIGS. 3 and 13, the wafer lifter 40 includes the water supporting member 41, a support bar 42 supporting the wafer supporting member 41, and a driving device 43 for vertically moving the support bar 42 to move raise and lower the wafer supporting member 41.

The driving device 43 includes a vertical threaded shaft 101, a stepping motor 102 for rotating the threaded shaft 101, a guide rail 103 extended in parallel to the threaded shaft 101, a sliding block 104 provided with an internal thread mating with the external thread of the threaded shaft 101, and slides 105 that slide along the guide rail 103. The stepping motor 102 drives the threaded shaft 101 for rotation to move the wafer supporting member 41 vertically. The threaded shaft 101, the sliding block 104 and balls, not shown, form a ball screw.

The wafer supporting member 41 is provided with wafer holding grooves 41a in its upper surface. The number of the wafer holding grooves 41a is twice the number of wafers w contained in a wafer carrier C, for example, fifty-two. The pitch of the wafer holding grooves 41a are equal to half that of the pitch of wafers W contained in a wafer carrier C. The wafer supporting member 41 can be horizontally shifted on a base member 44 by a distance equal to the pitch of the wafer holding grooves 41a, i.e., half the pitch of wafers contained in a wafer carrier C. More concretely, as shown in FIG. 13, a piston rod connected to a piston included in a cylinder actuator 106 and connected to the base member 44 is moved axially to shift the wafer supporting member 41 horizontally by a distance equal to the pitch of the wafer holding grooves 41a. Thus, cleaned wafers W can be received in the holding grooves 41a different from those in which the wafers W had been received before the wafers W were cleaned, so that possibility that the cleaned wafers W are contaminated with particles and such adhering to the grooves 41a in which the wafers W had been received before the same were cleaned can be reduced.

A piston rod connected to a piston included in a cylinder actuator 108 is connected to the base member 44 and the cylinder actuator 108 is attached to the support bar 42. A pressure regulator 113 provided with a pressure-relief valve is connected to the cylinder actuator 108. When raising wafers W by the wafer supporting member 41 to load the rotor 24 with the wafers W, the pressure-relief valve of the pressure regulator 113 opens to relieve pressure working on the piston of the cylinder actuator 108 upon the increase of pressure working on the piston of the cylinder actuator 108 beyond a predetermined limit, so that the piston rod of the cylinder actuator 108 is retracted. Therefore, breakage of the wafers W when loading the rotor 24 with the wafers W can be prevented even if a control apparatus for controlling the wafer lifter 40 should malfunction. A sensor 111 detects the lowering of the piston rod. Upon the detection of the lowering of the piston rod, the sensor 111 gives a detection signal to a controller 110, and then the controller 110 gives a command signal to an alarm device 112 to make the alarm device 112 generate an alarm.

As shown in FIG. 3, a wafer detector 115 including a plurality of pairs each of a light-emitting element and a light-receiving element disposed on the opposite sides, respectively, of a wafer carrying path is disposed above the carrier waiting portion 30 to count the number of wafers W as the wafers W pass by the wafer detector 115 and to find irregularly supported wafers (the so-called jump slots).

A series of operations of the wafer cleaning apparatus will be described. Wafer carriers C each containing, for example, twenty-six wafers W to be cleaned are carried onto the stage 10 of the in/out port 2 by an operator or an automatic carrying device.

The wafer carrier carrying mechanism 12 carries one of the wafer carriers C placed on the stage 10 onto the sliding table 32 of the container carrier 35 mounted on the stage 13 of the loading/unloading unit 4. The wafer carrier C placed on the sliding stage 32 can be turned through an angle of 180° in a horizontal plane by the reversing mechanism, not shown.

The shutter 15 is opened to open the opening 14a of the partition wall 14 and the sliding table 32 is moved onto the stage 31 of the carrier waiting portion 30 of the cleaning unit 3. The wafer carrier C is kept on the stage 31 of the carrier waiting portion 30.

Subsequently, the outer covering wall 26 and the inner covering wall 27 of the cleaning device 20 are set at their back positions, respectively, as shown in FIG. 3.

Figure 15:
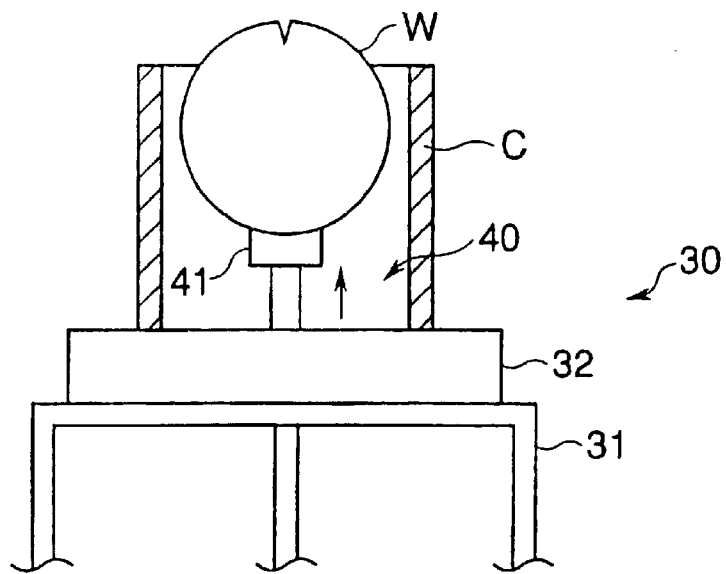
Figure 16:
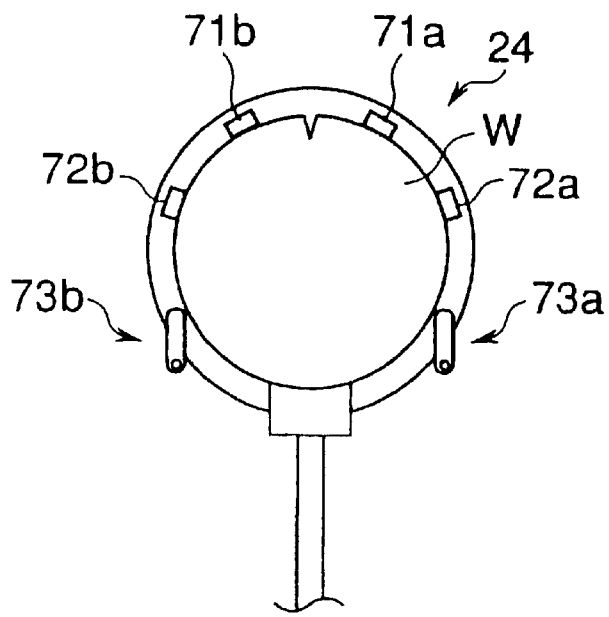

Then, as shown in FIG. 15, the wafer lifter 40 is actuated to raise the wafers W contained in the wafer carrier C mounted on the sliding table 32 on the stage 31 of the carrier waiting portion 30 by the wafer supporting member 41. While the wafers W is being raised, the wafer detector 115 counts the wafers W and examines the wafers W to see whether there is any jump slot. Then, as shown in FIG. 16, the wafers W are brought into contact with the first holding members 71a and 71b and the second holding members 72a and 72b of the rotor 24 with their peripheral portions received in the grooves 74 of the holding members 71a, 71b, 72a and 72b. In this state, the condition selecting members 92a and 92b are turned so as to enable the holding members 83a and 83b of the holding mechanisms 73a and 73b to be brought into contact with the wafers W from below the same to hold the wafers W on the rotor 24 as shown in FIG. 17. Subsequently, the wafer supporting member 41 is lowered.

Then, the outer covering wall 26 is moved to the working position shown in FIG. 4 and a cleaning process is started. The empty wafer carrier C kept on the stage at the wafer carrier waiting portion 30 is returned to the loading/unloading unit 4 by the container carrier 35 and is carried to the wafer carrier cleaning unit 5 by the wafer carrier carrying mechanism 12. The empty wafer carrier C is cleaned by the carrier cleaning unit 5. A cleaned, empty wafer carrier C is carried from the wafer carrier storage unit 6 to the carrier waiting portion 30 by the wafer carrier carrying mechanism 12 and the container carrier 35. The cleaned, empty wafer carrier C is kept on the stage of the waiting portion 30.

In the cleaning process, the inner covering wall 27 is moved to the working position shown in FIG. 5 and a first cleaning step is executed in the second chamber 52; the rotor 24 is rotated at a predetermined rotating speed and a chemical liquid (processing liquid) is sprayed by the spray pipes 56 on the wafers W to remove a resist remaining on the wafers W for cleaning.

After the first cleaning step has been completed, the inner covering wall 27 is retracted to the back position shown in FIG. 4, and then a second cleaning step is executed in the first chamber 51; the rotor 24 is rotated at a predetermined rotating speed and pure water is sprayed by the spray pipes 54 on the wafers W for rinsing.

Subsequently, a spin drying step is executed in the first chamber 51 in a state shown in FIG. 4, in which $N_2$ gas is jetted by the $N_2$ gas jetting pipe 57 while the rotor 24 is rotated at a rotating speed higher than that at which the rotor 24 is rotated in the second cleaning step.

After the cleaning and drying steps have been completed and the rotor 24 has been stopped, the outer covering wall 26 is retracted to the back position (the inner covering wall 27 is held at the back position) to expose the rotor 24. Then, the wafer supporting member 41 of the wafer lifter 40 is raised, the cleaned wafers W are transferred from the rotor 24 to the wafer supporting member 41. The wafer supporting member 41 is shifted horizontally by a distance corresponding to the pitch of the wafer holding grooves 41a before receiving the cleaned wafers W from the rotor 24 from a position at which the wafer supporting member 41 held the wafers W before the wafers W are transferred to the rotor 24 for cleaning. Consequently, the cleaned wafers W are received in the wafer holding grooves 41a different from those in which the wafers W subjected to the cleaning process had been held.

In the state where the cleaned wafers W are held on the wafer supporting member 41, the holding mechanisms 73a and 73b are in a condition shown in FIG. 17. Then, the condition selecting members 92a and 92b are turned to release the holding mechanisms 73a and 73b so that the holding mechanisms 73a and 73b are set in a condition shown in FIG. 16. This releasing operation for releasing the holding mechanisms 73a and 73b can be carried out only when the projections 88a and 88b are in the curved slots 93a and 93b, respectively, and the releasing operation cannot be performed when the projections 88a and 88b are in the guide groove 90. Therefore, it is scarcely possible that the holding mechanisms 73a and 73b are released and the wafers W fall off the rotor 24 during the cleaning process.

The wafer supporting member 41 holding the cleaned wafers W is lowered. The wafer detector 115 counts the cleaned wafers W for confirmation while the cleaned wafers W are being moved downward. The wafers W are received and held in the wafer holding grooves of the wafer carrier C when the wafer carrier C passes through the wafer carrier C kept on the stage 31 of the carrier keeping device 30.

Then, the wafer carrier C containing the cleaned wafers W is carried to the loading/unloading unit 4 by the container carrier 35 and to the stage 10 of the receiving/delivering unit by the wafer carrier carrying mechanism 12. The operator or the automatic carrying device delivers the wafer carrier C to the next destination.

Since the wafers W are supported from below the same on the wafer supporting member 41 while the wafers W are moved vertically, the wafers W do not need to be gripped by a gripping device when carrying the wafers W into the processing chamber and hence any special space for the operation of a gripping device need not be secured in the processing chamber. Therefore, the processing chamber of the wafer cleaning apparatus is compact.

Since the wafers W can be loaded on and unloaded from the rotor 24 only by the movement of the wafer supporting member 41 of the wafer lifter 40, complicated control operations are unnecessary for loading the wafers W on and unloading the same from the rotor 24 of the cleaning device 20, the wafers W can be very easily loaded on and unloaded from the rotor 24, and the construction of the wafer cleaning apparatus can be simplified.

Since the outer covering wall 26 and the inner covering wall 27 can be moved between the working position and the back position and the spray pipes for spraying a chemical liquid and a rinsing liquid are placed in the chambers defined by the covering walls 26 and 27, respectively, highly diversified cleaning processes can be carried out.

The outer covering wall 26 must be retracted before unloading the wafers W from the rotor 24 after the completion of the foregoing cleaning process. There is the possibility that the cleaning liquid drips when the outer covering wall 26 is retracted. It is preferable to connect a liquid collecting device 120 or a drip preventing device to the front end of a lower part of the outer covering wall 26 as shown in FIG. 19 to collect the liquid dripped from the outer covering wall 26 when the outer covering wall 26 is retracted. As shown in FIG. 20, the liquid collecting device 120 includes a liquid tray 121 connected to the outer covering wall 26 so as to be movable and a drain tray 122 provided with a drain port 129. A liquid received by the liquid tray 121 is drained into a drain line through the drain tray 122. Two support members 123a and 123b are fastened to the outer covering wall 26 with screws. Opposite end parts of a pair of guide shafts 124a and 124b are supported on the support members 123a and 123b. A slide member 125 is fixed to the liquid tray 121 and is supported for sliding on the guide shafts 124a and 124b. A compression coil spring 126 or the pressing element is extended between the slide member 125 and the support member 123b. When the outer covering wall 26 is moved to the working position, the compression coil spring 126 is compressed and the front end wall 127 of the liquid tray 121 is pressed against an end part 130 of the vertical wall 26b by the resilience of the compression coil spring 126. In an initial stage of retraction of the outer covering wall 26 after the completion of the cleaning process, the front end wall 127 of the liquid tray 121 is kept in contact with the end part 130 of the vertical wall 26b by the resilience of the compression coil spring 126. Therefore, the liquid that drips from the front end of the outer covering wall 26 upon the separation of the outer covering wall 26 from the vertical wall 26b can be received by the liquid tray 121 to prevent the dripping of the liquid. The liquid received by the liquid tray 121 flows along the bottom wall 128 of the liquid tray 121 and the drain tray 122 and is drained through the drain port 129 into the drain line. Note that an air cylinder actuator may be used as the pressing element instead of the coil spring 126.

Modifications of the cleaning apparatus in the first embodiment are possible. For example, wafers taken out of a wafer carrier may be carried to carrier waiting portion 30, and then the wafers, standing by at waiting portion 30, may be raised to the rotor 24.

Although the cleaning apparatus in the first embodiment carries out the cleaning process using a chemical liquid in the second chamber 52 defined by the inner covering wall 27 and carries out the raising and drying processes in the first chamber 51 defined by the first covering wall 26, the cleaning process may be carried out in the first chamber defined by the outer covering wall 26, the rinsing process may be carried out in the second chamber 52 defined by the inner covering wall 27 or the first chamber 51 and the second chamber 52 may be alternatively used for the cleaning process.

Although the cleaning apparatus in the first embodiment is provided with the outer covering wall 26 and the inner covering wall 27 to define the two processing chambers, the cleaning apparatus may be provided with three or more covering walls or a single covering wall.

Although the cleaning apparatus in the first embodiment exposes the rotor 24 by retracting the outer covering wall 26 and the inner covering wall 27 to their back positions, the vertical wall 26b may be provided with an opening covered and a cover covering the opening, and the rotor 24 may be exposed by opening the cover and moving the rotor 24 horizontally through the opening of the vertical wall 26b.

Figure 21:
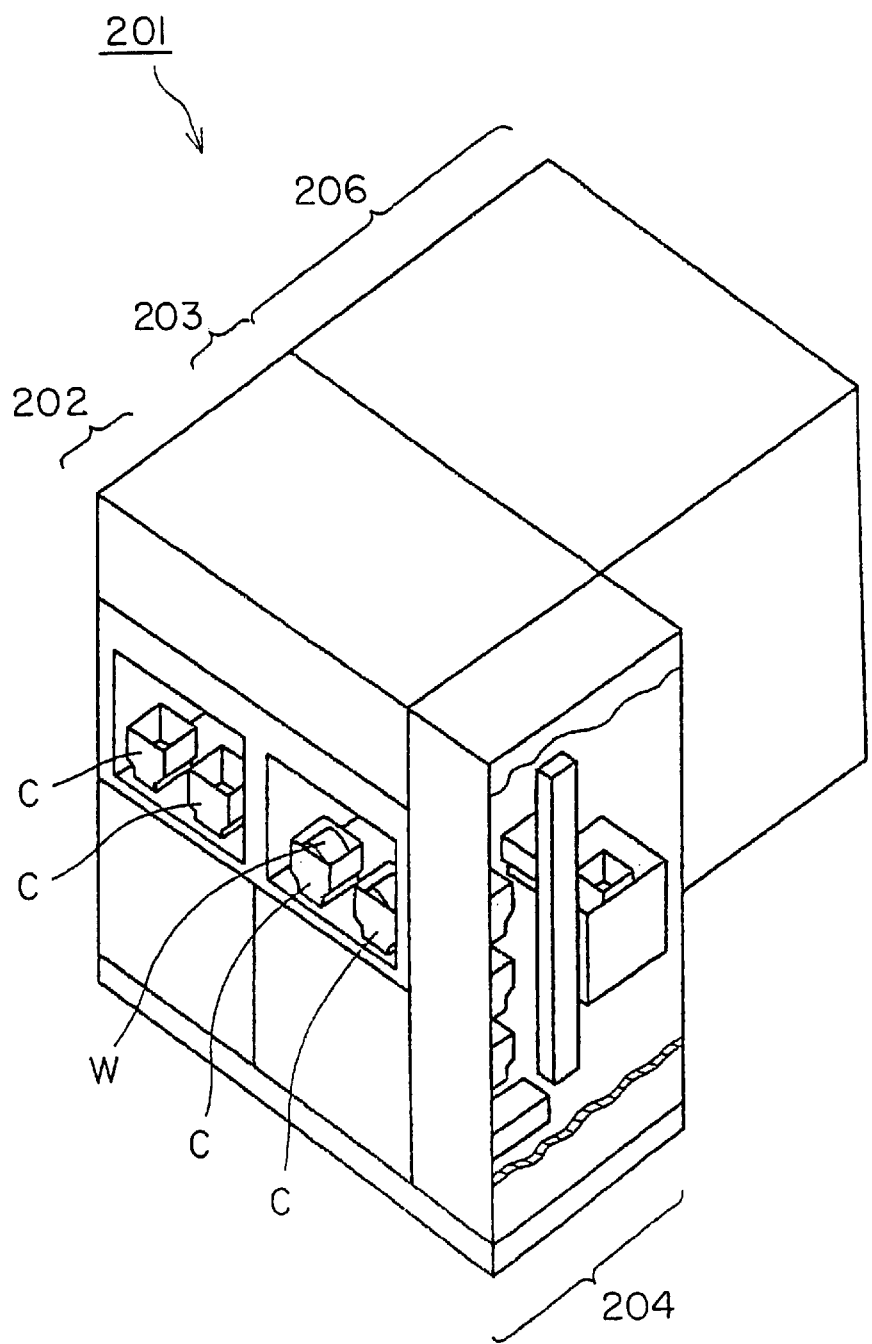
FIG. 21 is a perspective view of a wafer cleaning apparatus in a second embodiment according to the present invention.
Figure 22:
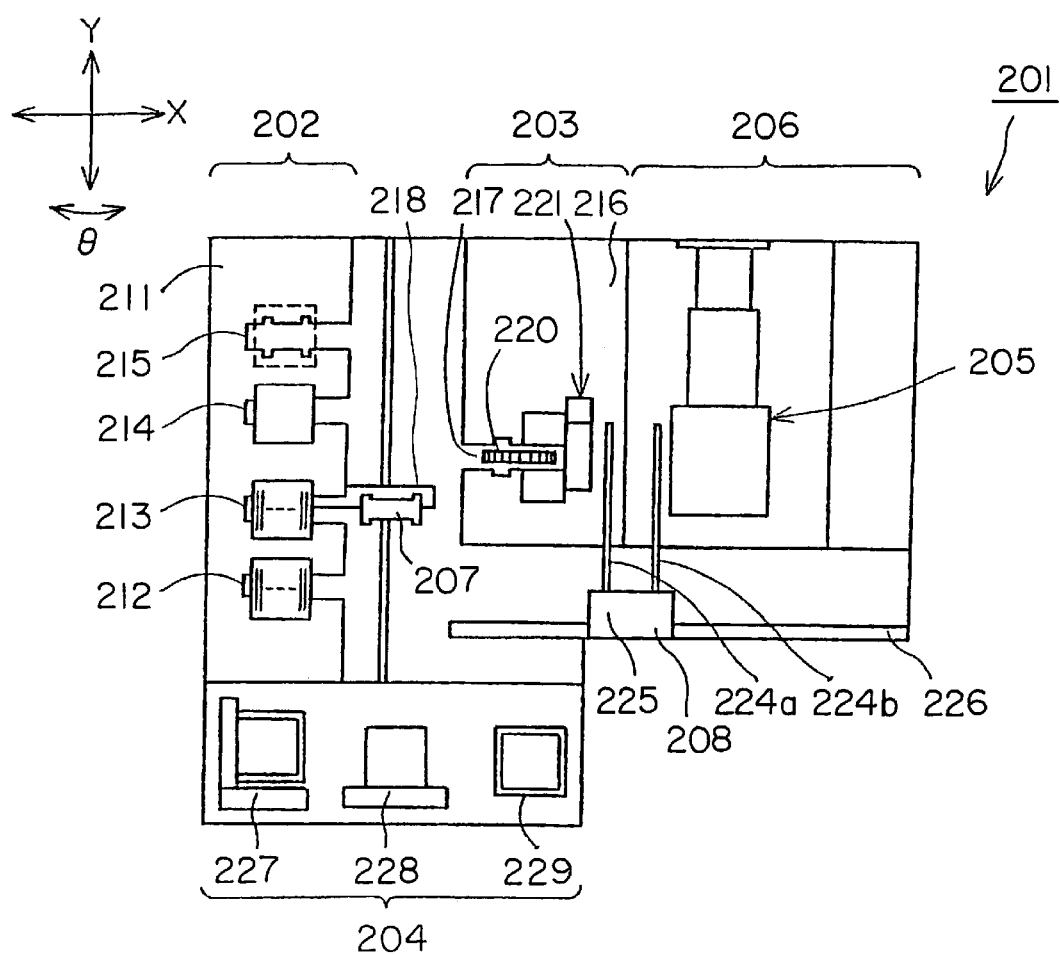
FIGS. 22 is a schematic plan view of the wafer cleaning apparatus shown in FIG. 21.

A cleaning apparatus 201 in a second embodiment according to the present invention will be described hereinafter. Referring to FIGS. 21 and 22, the cleaning apparatus 201 has a receiving delivering unit, i.e., an in/out port 202 for receiving and delivering a wafer carrier C containing wafers W, a loading/unloading unit 203 that takes out not cleaned wafers W from a wafer carrier C and puts cleaned wafers W into a wafer carrier C, a wafer carrier storage unit 204 for storing wafer carriers C, and a cleaning unit 206 provided with a wafer cleaning device 205. The cleaning apparatus 201 is provided with a wafer carrier carrying table 207 that carries a wafer carrier C, and a wafer carrying device 208 that grips and carries wafers W. The wafer carrier carrying table 207 can be moved between the in/out port 202 and the loading/unloading unit 203. The wafer carrying device 208 is able to move between the loading/unloading unit 203 and the cleaning unit 206, more specifically, a transfer position 234 in the cleaning unit 206.

The in/out port 202 is provided with a stage 211 for supporting wafer carriers C thereon. The stage 211 is provided with a plurality of openings at stations 212, 213, 214 and 215 in which wafer carriers C are placed. Lower peripheral parts of wafer carriers C are supported on the edges of the openings of the stations 212 to 215, respectively. Normally, wafer carriers C containing not cleaned wafers W are placed at the stations 212 and 213 and wafer carriers C containing cleaned wafers W are placed at the stations 214 and 215. The loading/unloading unit 203 has a stage 216 provided with a station 217.

The wafer carrier carrying table 207 can be moved by a table moving mechanism 218 in directions parallel to a direction in which wafer carriers C are arranged on the stage 211, i.e., in directions indicated by the arrows X in FIG. 22, and in directions parallel to a direction in which the in/out port 202, the loading/unloading unit 203 and the cleaning unit 206 are arranged, i.e., in the directions of the arrows Y in FIG. 22. The wafer carrier carrying table 207 is moved through one of the openings of the stations 212 to 215 and 217 to receive a wafer carrier C located at the corresponding station and carries the wafer carrier C to another station.

Figure 23:
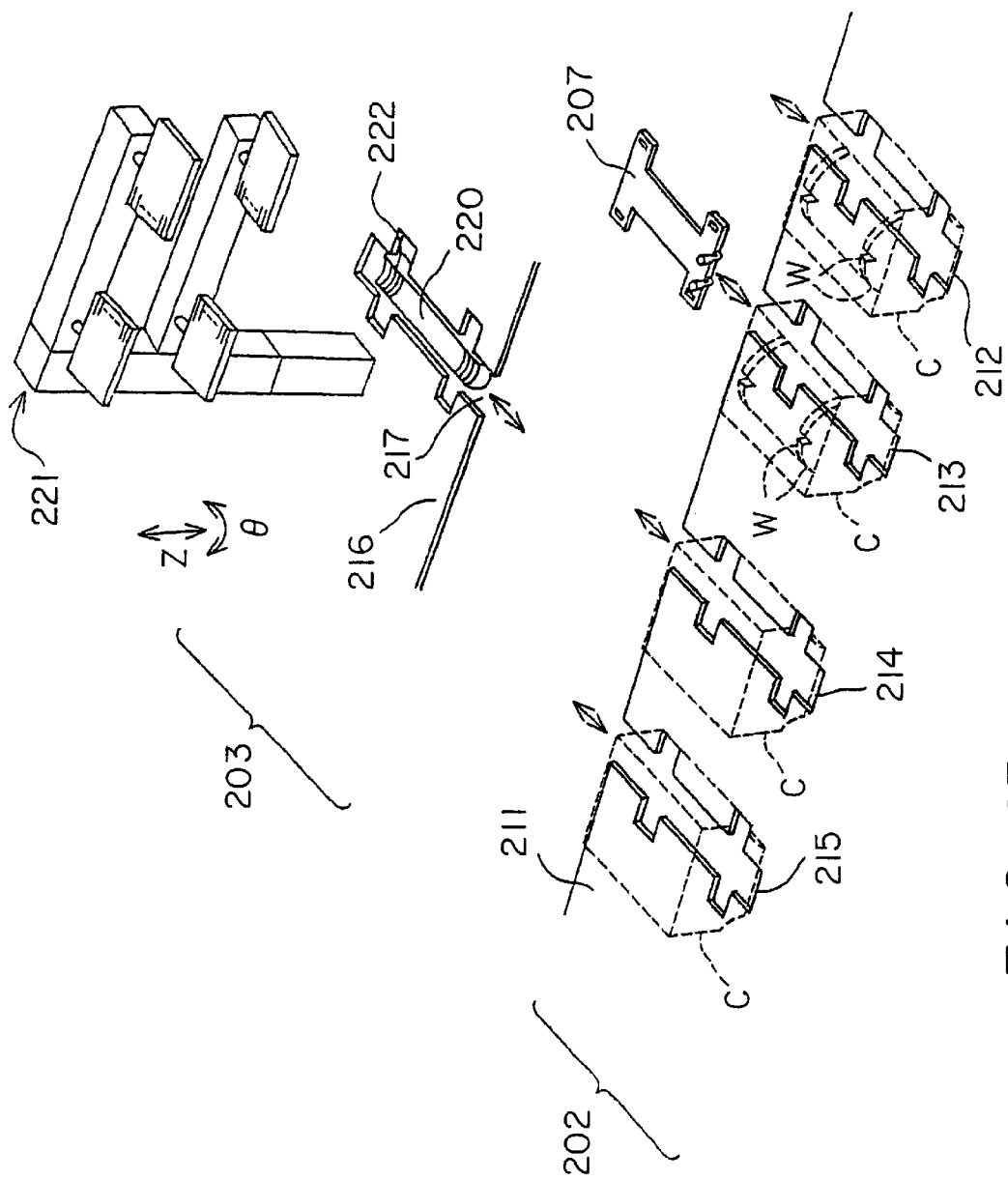
FIG. 23 is a perspective view of essential portions of a receiving/delivering unit and a loading/unloading unit shown in FIG. 22.

Referring to FIG. 23, a loading/unloading hand 220 is disposed under the stage 216 of the loading/unloading unit 203. The loading/unloading hand 220 can be moved in vertical directions, i.e., in the direction of the arrows Z, and can be turned in a horizontal plane in the directions of the arrows θ by a lifting and turning mechanism, not shown. The loading/unloading hand 220 is provided in its upper surface with a plurality of grooves 222 for receiving lower peripheral portions of wafers W. When the loading/unloading hand 220 is raised, the loading/unloading hand 220 enters a wafer carrier C mounted on the stage 216 through an opening formed in the bottom wall of the wafer carrier C and lifts up a plurality of wafers W contained in the wafer carrier C.

A pitch changer 221 is mounted on the stage 216. The pitch changer 221 is capable of rearranging the plurality of wafers W (twenty-six wafers) lifted up from the wafer carrier C by the loading/unloading hand 220 at a pitch equal to half a pitch at which the wafers W are arranged in the wafer carrier C to arrange the wafers W in a length equal to about half the length in which the wafers W are arranged in the wafer carrier C.

As shown in FIG. 22, the wafer carrying device 208 has stretchable wafer support arms 224a and 224b capable of being moved toward and away from each other and a slide base 225 capable of sliding along a guide rail 226 in the directions of the arrows X.

The wafers carrier storage unit 204 has wafer carrier keeping devices 227 and 228 and a wafer carrier cleaner 229, which are arranged in a row. The wafer carrier keeping devices 227 and 228 are used for temporarily keeping empty wafer carriers C emptied by taking out not cleaned wafers W therefrom in the loading/unloading unit 203 and for keeping clean wafer carriers C for containing cleaned wafers W. The wafer carrier carrying table 207 carries a wafer carrier C into a vacant space in the storage device 227 or 228 and carries out a wafer carrier C from the storage device 227 or 228.

The wafer carrier carrying table 207 may carry a wafer carrier C into and may take out a wafer carrier C from a specified place in either the storage device 227 or 228. When the wafer carrier carrying table 207 is operated in such a mode, the storage unit 204 is provided with a lifter, not shown, a the lifter transfers a wafer carrier C from the specified place to a vacant place in the storage device 227 or 228 and transfers a stored wafer carrier C from a storage place in the storage device 227 or 228 to the specified place.

The cleaning unit 206 will be described with reference to FIGS. 24 to 38. A cleaning device 20 provided at the cleaning unit 206 is identical with the cleaning device 20 employed in the first embodiment and hence the description thereof will be omitted to avoid duplication.

In the cleaning unit 206, a wafer hand 233 or a wafer lifter is disposed below the rotor 24 of the cleaning device 20. The wafer hand 233 can be vertically moved between a wafer transfer position 234 in which wafers W are put on and taken off the wafer hand 233 and a waiting position 235 where the wafer hand 233 is kept for waiting. The waiting position 235, the rotor 24 and the transfer position 234 are arranged in that order.

Figure 24:
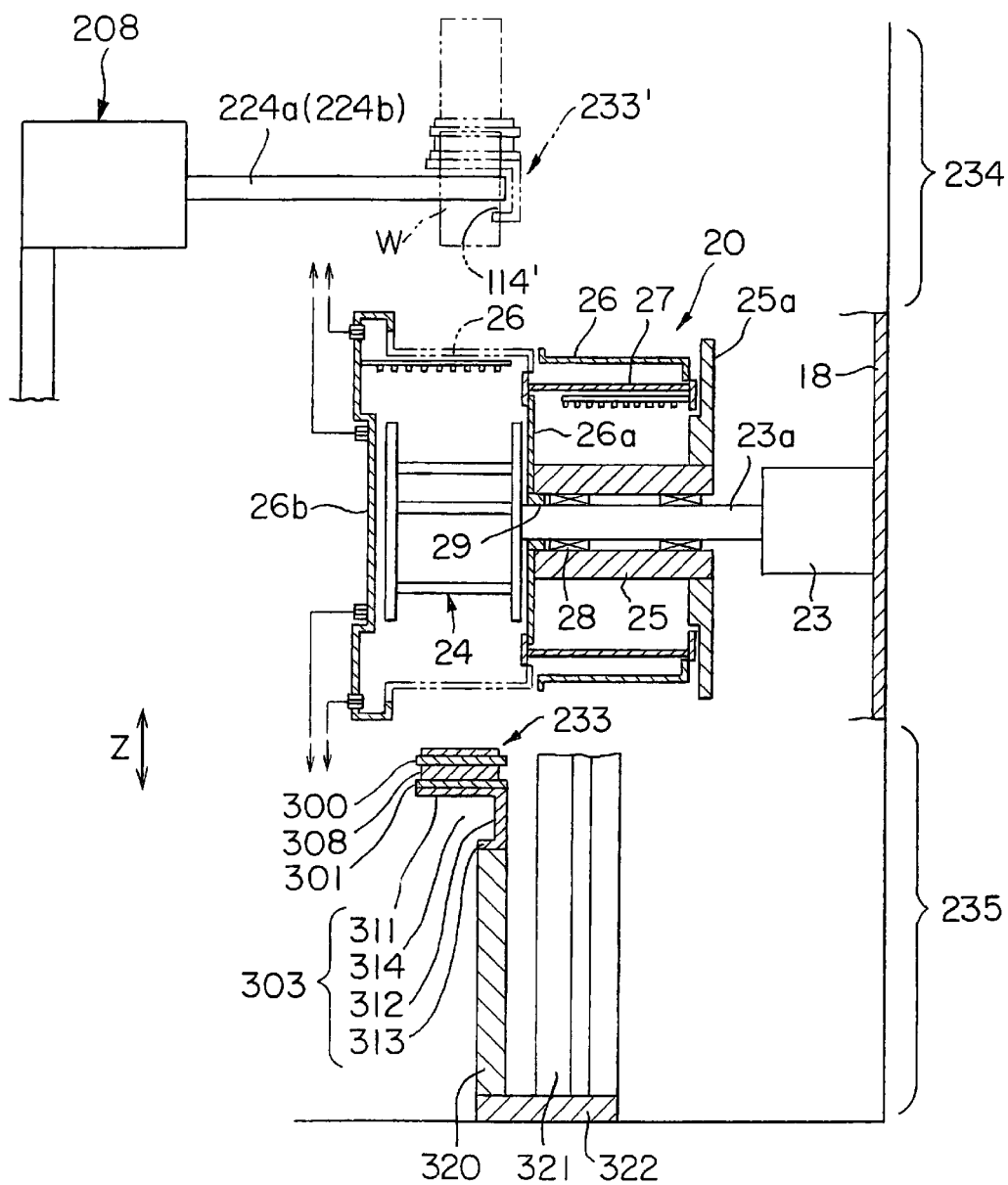
FIG. 24 is a sectional view of a cleaning unit included in the wafer cleaning apparatus shown in FIG. 21.
Figure 26:
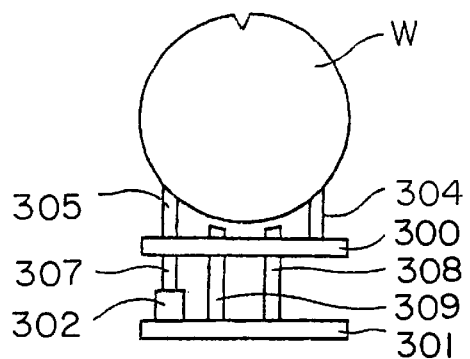
FIG. 26 is a typical view of a first supporting member of a wafer lifter shown in FIG. 25 supporting a wafer.

Referring to FIGS. 24 to 26, the wafer hand 233 i.e., the substrate moving mechanism is equipped with a first support plate 300 (i.e., a substrate support member) for supporting wafers W from below the same, a second support plate 301 (i.e., a substrate support member) for supporting wafers W from below the same, a lifting mechanism 302 mounted on the second support plate 301, and a base 303 on which the second support plate 301 is mounted.

First support members 304 and 305 are fixed to laterally opposite ends of the first support plate 301, respectively. A plurality of grooves 309 for receiving lower peripheral portions of wafers W are arranged at a predetermined pitch in the upper end surfaces of the first support members 304 and 305 extending perpendicularly to the paper.

A lifting rod 307 included in the lifting mechanism 302 is connected to the lower surface of the first support plate 300. Second support members 308 and 309 are fixed to the upper surface of the second support plate 301 so as to project into a space between the first support members 304 and 305. The second support members 308 and 309 extend through and project upward from the first support plate 300. A plurality of grooves 310 for receiving lower peripheral portions of wafers W are arranged at a predetermined pitch in the upper end surfaces of the second supports 308 and 309 extending perpendicularly to the paper.

When the lifting rod 307 of the lifting mechanism 302 is extended to raise the first support plate 300 so that the upper ends of the first support members 304 and 305 are on a level above that of the upper ends of the second support members 308 and 309, lower peripheral portions of wafers W can be supported on only the first support members 304 and 305.

Figure 27:
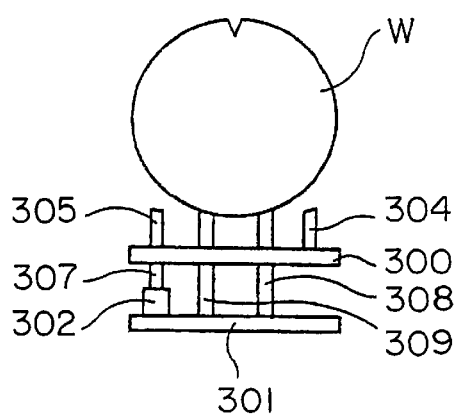
FIG. 27 is a typical view of a second supporting member of the wafer lifter shown in FIG. 25 supporting a wafer.

When the lifting rod 307 of the lifting mechanism 302 is retracted to lower the first support plate 300 so that the upper ends of the first support members 304 and 305 are on a level lower than that of the upper ends of the second support members 308 and 309, lower peripheral portions of wafers W can be supported on only the second support members 308 and 309 as shown in FIG. 27. Therefore, when the first support members 304 and 305 are used for supporting not cleaned wafers W and the second support members 308 and 309 are used for supporting cleaned wafers W, it is possible to prevent contamination of the cleaned wafers W with particles fallen off the not cleaned wafers W and adhering to the first support members 304 and 305.

The base 303 of the wafer hand 233 is put on and connected to the upper end of a support rod 320. The support rod 320 is fixedly supported on a lifting member 322 that is moved vertically along a guide rail 321, i.e., in the directions of the arrows Z in FIGS. 24 and 25. In FIG. 24, the wafer hand 233 indicated by continuous lines is at a lower waiting position in the waiting position 235, and the wafer hand 233 indicated by two-dot chain lines (233') is the transfer position 234 to receive wafers W from the wafer carrying device 208 or to transfer wafers W to the wafer carrying device 208.

The base 303 has a horizontal top part 311 to which the second support plate 301 is fixed, a vertical side part 312 supporting the top part 311 in a horizontal position and a horizontal bottom part 313 supporting the side part 312 in a vertical position. A space 314 is formed between the top part 312 and the bottom part 313. The wafer support arms 224a and 224b of the wafer carrying device 208 are extended through the space 314.

A series of operations of the wafer cleaning apparatus will be described. Two wafer carriers C each containing, for example, twenty-six wafers W to be cleaned are carried to the in/out port 202 and are placed at the stations 212 and 213 by, for example, an operator. The wafer carrier carrying table 207 carries the wafer carrier C placed at the station 213 to the loading/unloading unit 203. In the loading/unloading unit 302, the wafers W are unloaded from the wafer carrier C, and the twenty-six wafers W are rearranged at a pitch equal to about half a pitch at which the wafers W are arranged in the wafer carrier C by the pitch changer 221 in a wafer group. Subsequently, the wafer carrier C placed at the station 212 is carried to the loading/unloading unit 203, the twenty-six wafers W are unloaded from the wafer carriers C and the wafers W are rearranged at a pitch equal to about half a pitch at which the wafers W are arranged in the wafer carrier C in a wafer group. The wafer groups each of the twenty-six wafers W are combined to form a wafer group of the fifty-two wafers W arranged at a pitch equal to about half a pitch at which the wafers W are arranged in the wafer carriers W.

Figure 28:
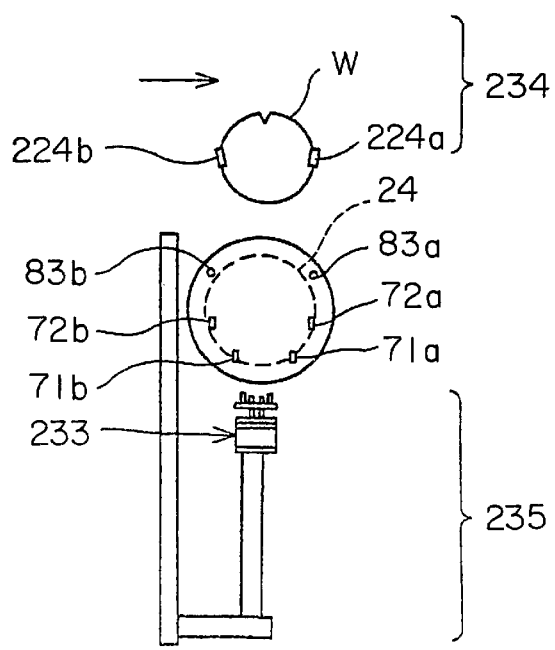
FIGS. 28 to 35 are typical views of assistance in explaining a transfer procedure or transferring wafers between a wafer carrying arm and a rotor.

The wafer carrying device 208 holds the wafer group of the fifty-two wafers and carries the same to the cleaning unit 206. The wafer carrying device 208 moves to the transfer position 234, i.e., a wafer waiting portion in the cleaning unit 206 as shown in FIG. 28.

The outer covering wall 26 and the inner covering wall 27 of the cleaning device are retracted to their back positions.

Figure 29:
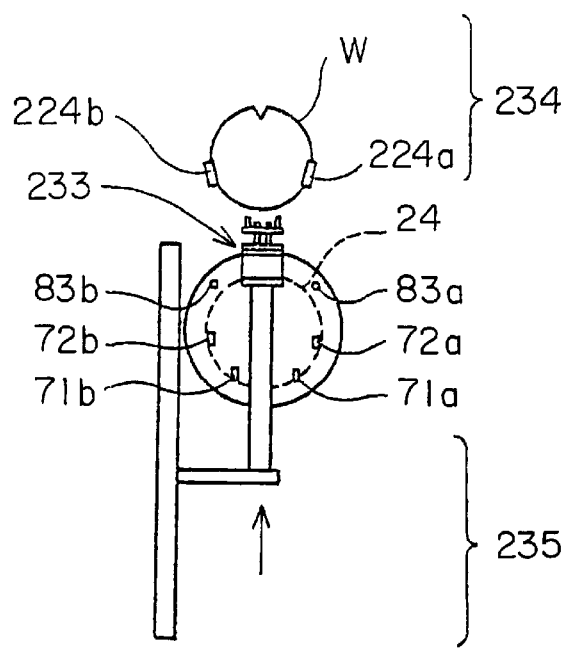

Then, as shown in FIG. 29, the wafer hand 233 is raised toward the transfer position 234. The wafer lifting hand 233 with its components set in an arrangement shown in FIG. 26 is raised through spaces between the corresponding holding members of the rotor 24.

Figure 30:
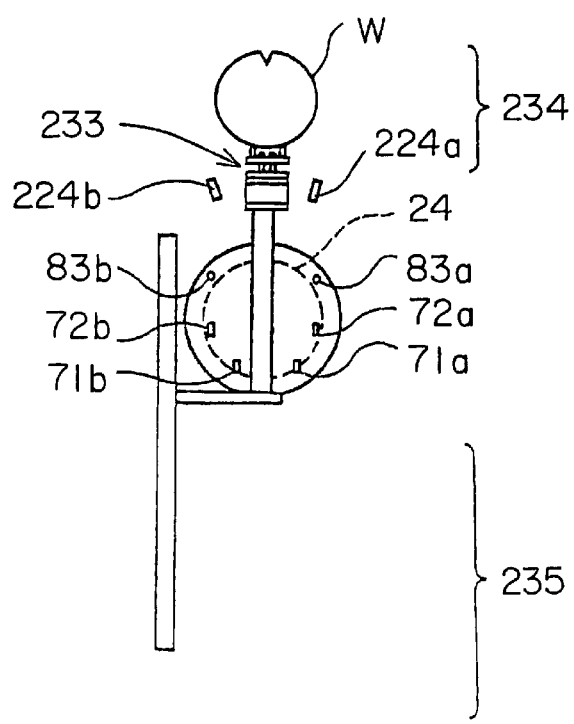
Figure 31:
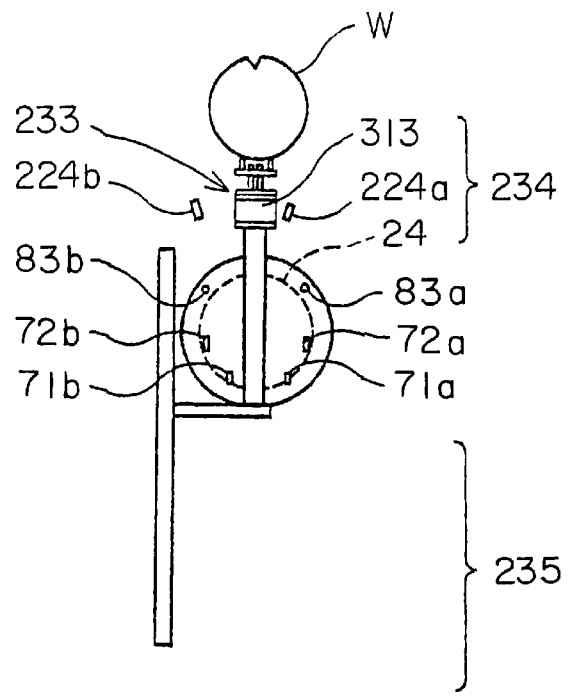

As shown in FIG. 30, the wafer hand 233 raised into the transfer position 234 lifts up the not cleared wafers W from the wafer support arms 224a and 224b to receive the wafers W from the wafer carrying device 208. When the wafers W are thus transferred from the wafer carrying device 208 to the wafer hand 233, the wafer support arms 224a and 224b are on the level of the space 314 as shown in FIG. 24. Therefore, the wafer support arms 224a and 224b can be moved through the space 314 to retract the wafer carrying device 208 from the wafer cleaning device 205 (FIG. 31).

Since the wafer holding arms 224a and 224b of the wafer carrying device 208 are moved only laterally and the wafer hand 233 supports the wafer W from below the same, the transfer operation for transferring the wafers W from the wafer carrying device 208 to the wafer hand 233 is not obstructed and can be easily achieved. Therefore, the wafer carrying device 208 can be controlled by a control program of a simple algorithm, the wafer holding arms 224a and 224b do not need to be provided with any obstacle sensor and any complicated feedback control apparatus for controlling the wafer carrying device 200 is not necessary.

Figure 32:
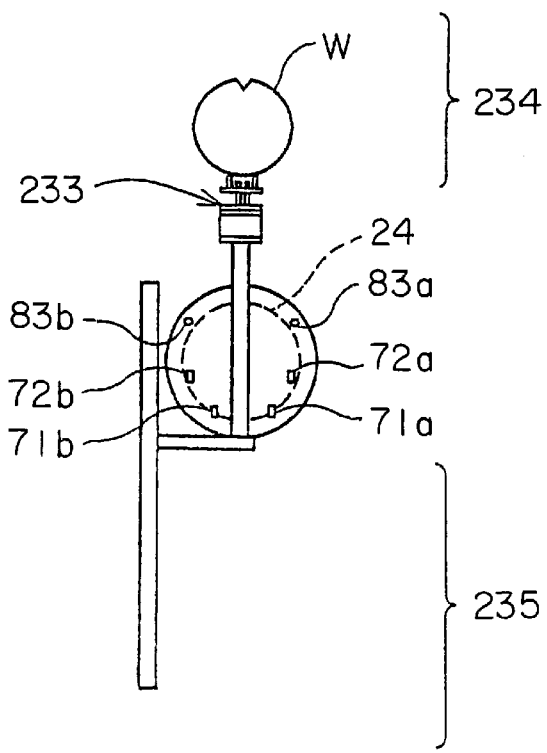
Figure 33:
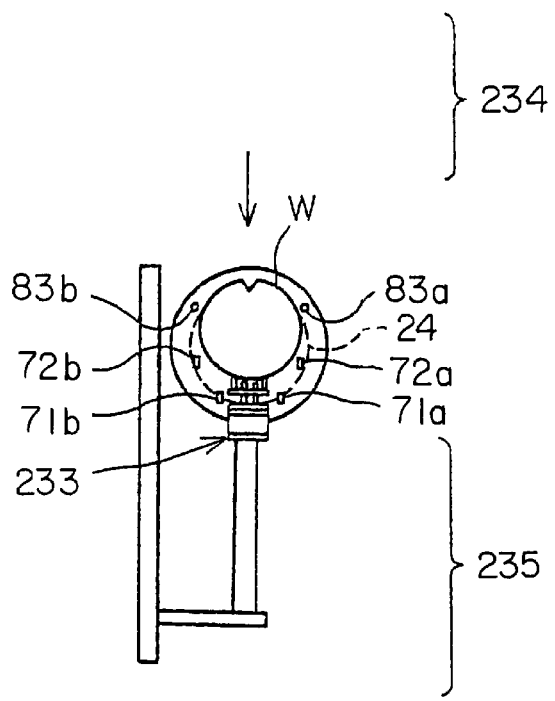
Figure 34:
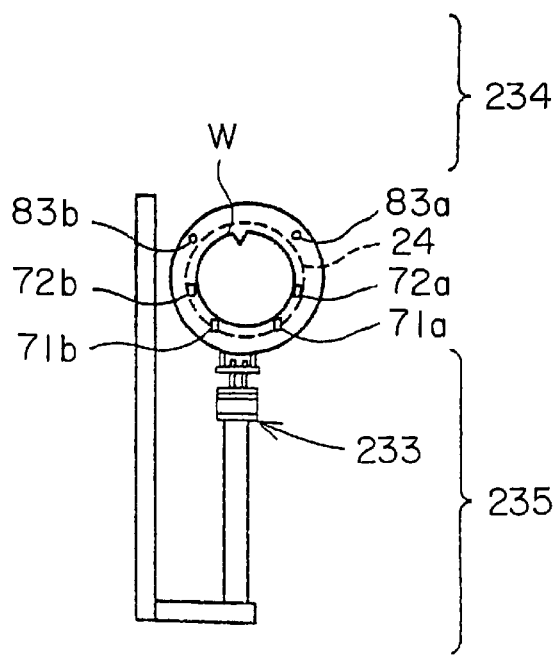
Figure 35:
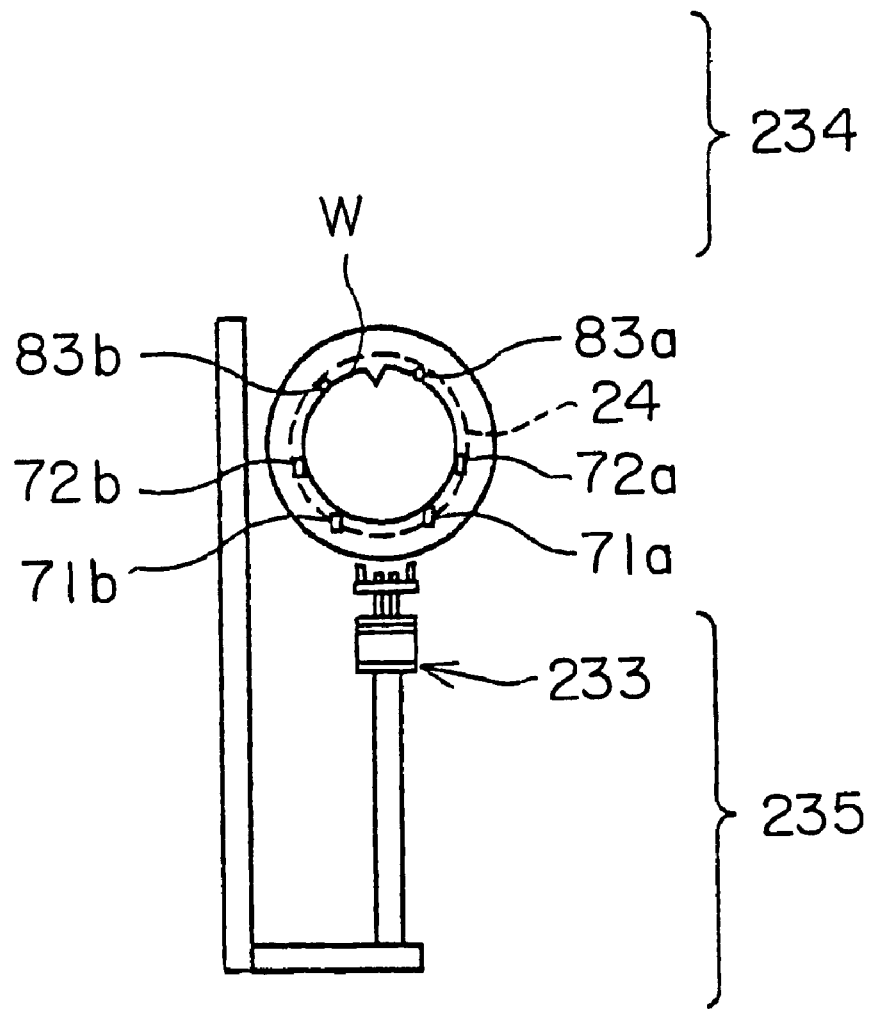

After the wafer carrying device 200 has been moved away from the cleaning unit 206 as shown in FIG. 32, the wafer hand 233 is lowered as shown in FIG. 33. As the wafer hand 233 is lowered toward the waiting position 235, the wafers W are transferred from the wafer hand 233 to the first holding members 71a and 72b and the second holding members 72a and 72b of the rotor 24 as shown in FIG. 34. The wafer hand 233 is stopped temporarily or the lowering speed of the wafer hand 233 is reduced immediately before the wafers W come into contact with the holding members 71a, 71b, 72a and 72b for safety.

Then, the holding mechanisms 73a and 73b of the rotor 24 is operated to bring third holding members 288a and 288b into engagement with peripheral portions of the wafers W so that the wafers W are held securely on the rotor 24.

The outer covering wall 26, the inner covering wall 27, the rotor 24 and other components of the cleaning unit 206 are operated by the same procedure as that previously described in connection with the first embodiment to carry out the cleaning process and the drying process. During the cleaning process and the drying process, the wafer hand 233 is held in the waiting position.

After the completion of the cleaning process and the drying process, the outer covering wall 26 and the inner covering wall 27 are retracted to their back positions and the wafers W are carried out of the wafer cleaning device 205.

The components of the wafer lifting hand 233 are set in an arrangement as shown in FIG. 27 and the steps previously described with reference to FIGS. 28 to 35 are reversed. Thus, the cleaned wafers W are held by the wafer carrying device 208. During those operations for holding the cleaned wafers W by the wafer carrying device 208, the wafer support arms 224a and 224b of the wafer carrying device 208 are move only laterally. The wafer carrying device 208 carries the cleaned wafers W to the loading/unloading unit 203. Then, the cleaned wafers W are put in wafer carriers C and the wafer carriers C are placed at the stations 214 and 215 of the in/out port 202. Then, the wafer carriers C containing the cleaned wafers W are delivered to the next destination.

Figure 36:
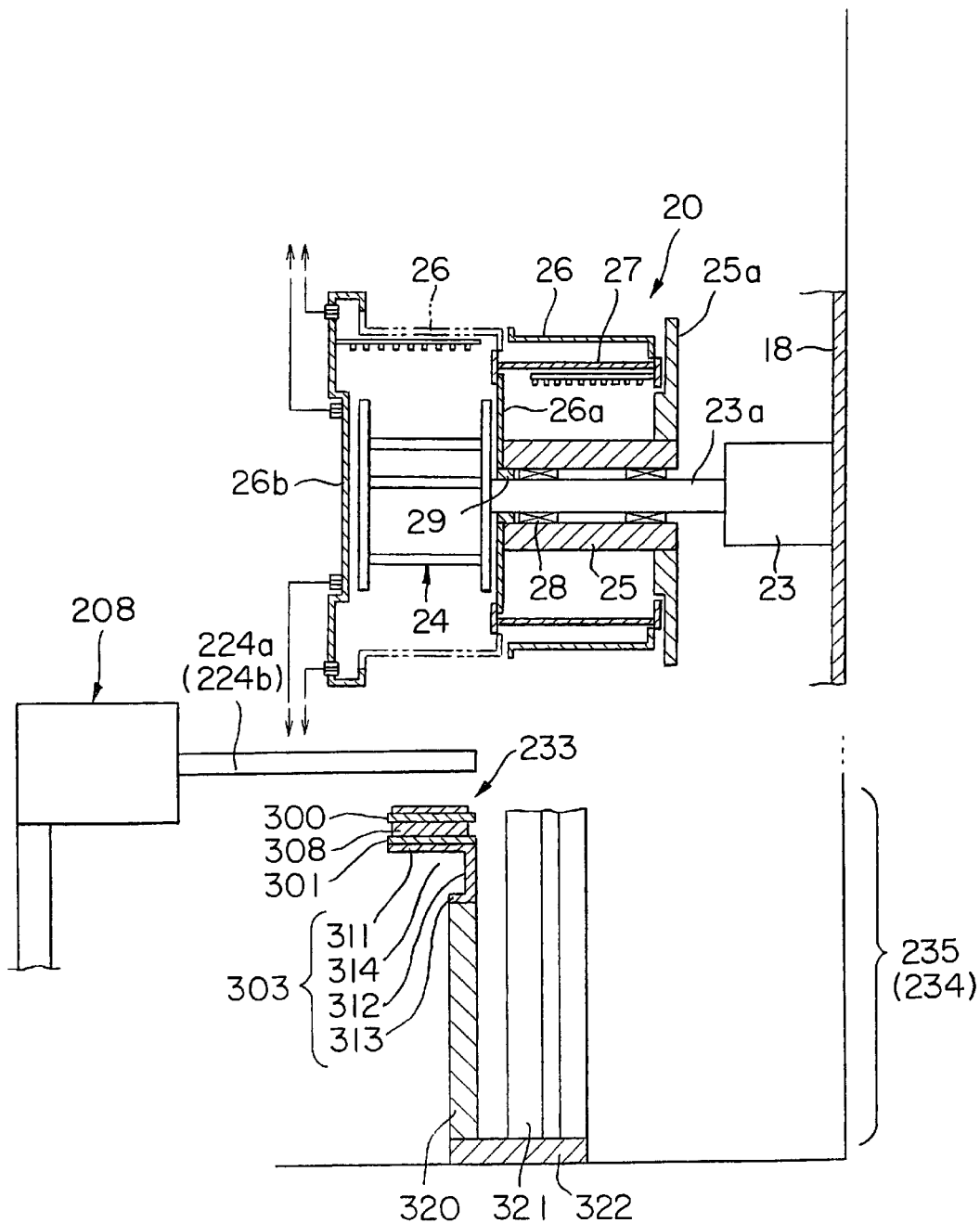
FIG. 36 is a schematic sectional view of a wafer cleaning apparatus in a modification of the second embodiment.

Various modifications are possible in the cleaning apparatus in the second embodiment. For example, wafers W may be transferred from the wafer carrying device 208 to the wafer hand 233 at a position below the rotor 24 as shown in FIG. 36. In this case, the wafer carrying device 208 holding the wafers W is located at a position above the wafer hand 233 and below the rotor 24 (i.e., wafer waiting portion), and then the wafers W are transferred from the wafer carrying device 208 to the wafer hand 233 by a procedure similar to that described previously with reference to FIGS. 29 to 31. The procedure is different from that described in connection with FIGS. 29 to 31 only in the position where the wafers W are transferred from the wafer carrying device 208 to the wafer hand 233. The wafers W are transferred from the wafer hand 233 to the rotor 24 by the same procedure as that described previously in connection with the first embodiment with reference to FIGS. 16 to 18, in which the wafer hand 233 is used instead of the wafer supporting member 41.

Figure 37:
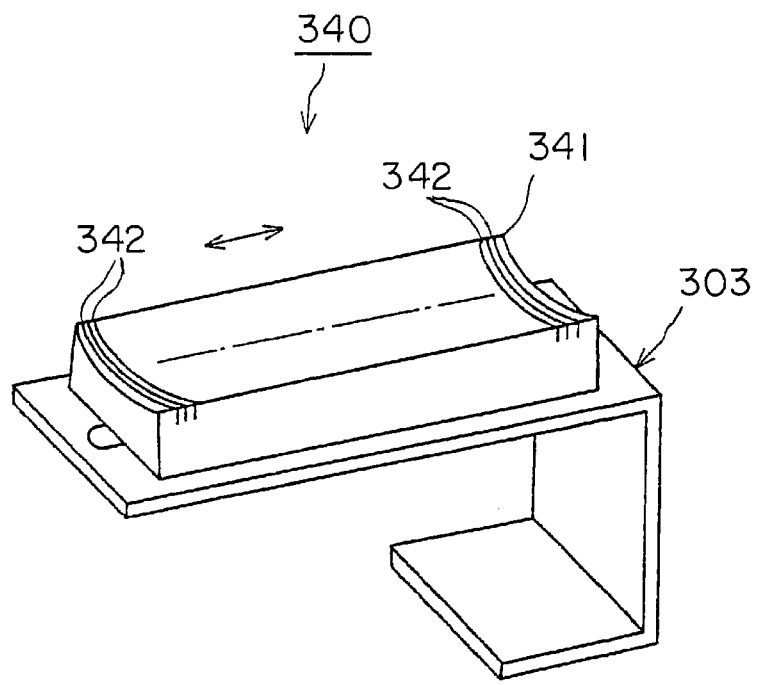
FIG. 37 is a perspective view of a wafer lifter in a modification.

A wafer hand 340 shown in FIG. 37 may be employed instead of the wafer hand 233. The wafer holding device 340 has a base 303 and a support member 341 slidable on the base 303. The support member 341 is provided in its upper surface with wafer holding grooves 342. The number of the grooves 342 is twice (or an integral multiple greater than twice of) the number of the grooves 306 (309) formed in the first support members 304 and 305 (the second support members 307 and 308). The pitch of the grooves 342 is half that of the grooves 306 (309). Therefore, the cleaned wafers W can be received in the grooves different from those in which the not cleaned wafers W had been received before the same were cleaned by longitudinally shifting the support member 341 by a distance equal to the pitch of the grooves 342, so that contamination of the cleaned wafers W with particles and such adhering to the grooves in which the not cleaned wafers W had been received before the same were cleaned can be prevented.

Figure 38:
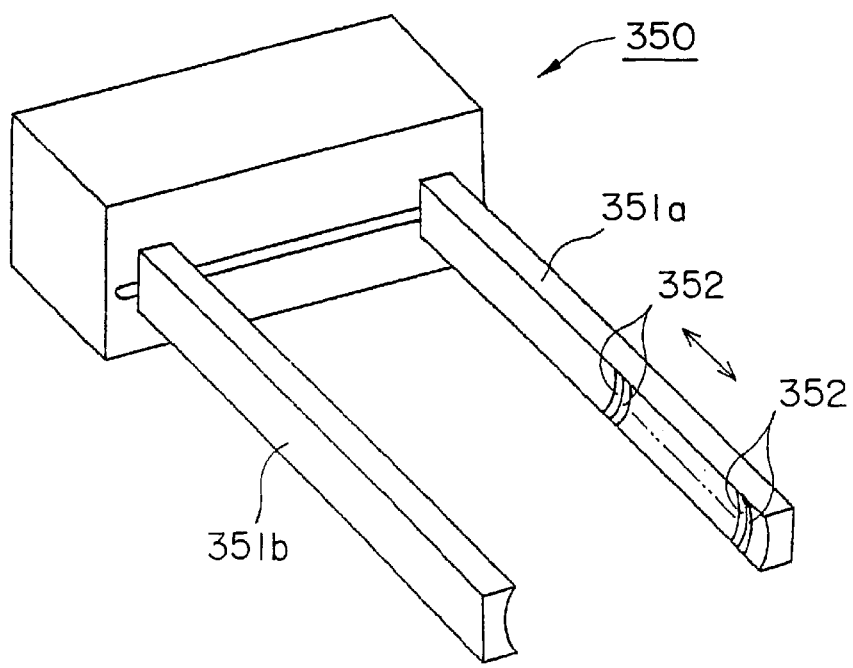
FIG. 38 is a perspective view of a wafer carrying arm in a modification.
Figure 39:
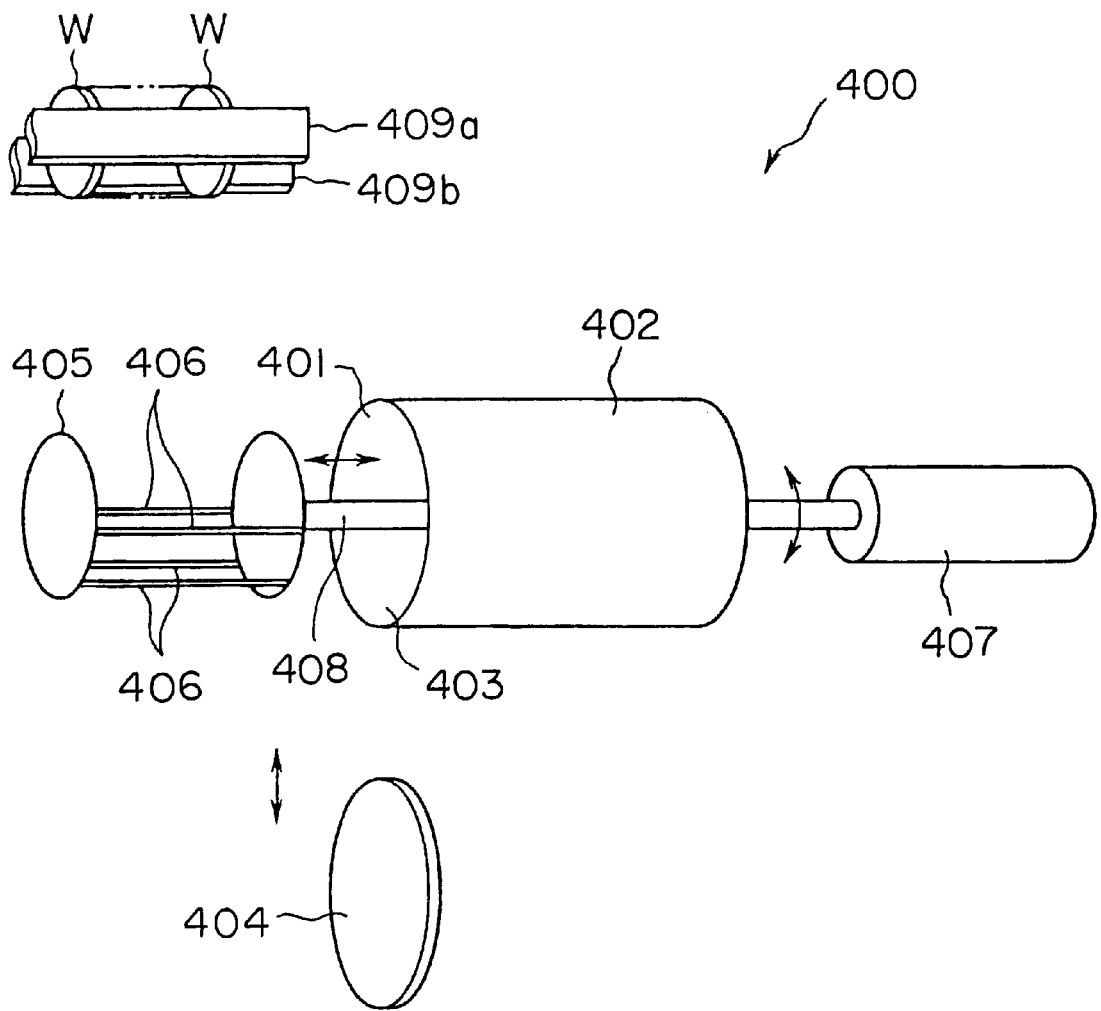
FIG. 39 is a perspective view of a conventional wafer cleaning apparatus.

A wafer carrying device 350 shown in FIG. 38 may be employed instead of the wafer carrying device 208. The wafer carrying device 350 has wafer support members 351a and 351b provided in their inner surfaces with wafer holding grooves 352. The number of the grooves 352 is twice (or an integral multiple greater than twice of) the number of the grooves formed in the wafer support arms 224a and 224b of the wafer carrying device 208. The pitch of the grooves 352 is half that of the grooves of the wafer support arms 224a and 224b. Therefore, the cleaned wafers W can be received in the grooves different from those in which the not cleaned wafers W had been received before the same were cleaned by longitudinally shifting the wafer support arms 351a and 351b by a distance equal to the pitch of the grooves 352, so that contamination of the cleaned wafers W with particles and such adhering to the grooves in which the not cleaned wafers W had been received before the same were cleaned can be prevented.

Although the invention has been described in its preferred embodiments as applied to the cleaning apparatus, the present invention is not limited thereto in its practical application. The present invention is applicable to liquid application apparatus for applying a predetermined coating liquid to workpieces, CVD apparatus, etching apparatus and the like. The substrates are not limited to semiconductor wafers, but may be LCD plates and such.

What is claimed is:

1. A substrate processing apparatus comprising:
   a substrate processing portion at which a plurality of substrates are treated by a process;
   a substrate waiting portion at which the substrates stand by for the process, the waiting portion being arranged below the processing portion; and
   a substrate lifter including a substrate supporting member configured to support the substrates from below the substrates, the supporting member being capable of vertical movement, wherein the lifter supports the substrates placed at the waiting portion and raises the substrates thereby moving the substrates from the waiting portion to the processing portion, and wherein the lifter supports the substrates placed in the processing portion and lowers the substrates thereby moving the substrates from the processing portion to the waiting portion, and
   wherein the substrate processing portion is provided with a substrate holding device configured to hold the substrates while the structures are being treated and a first covering member defining at least part of a processing chamber in which the substrate holding device is disposed, and wherein the substrate waiting portion and the substrate lifter are disposed below the substrate holding device, and substrates are transferred between the substrate holding device and a substrate supporting member.

2. The substrate processing apparatus according to claim 1 further comprising a substrate container carrier configured to carry a substrate container into the substrate waiting portion and to carry the substrate container from the substrate waiting portion, wherein the substrates are contained in the substrate container while the substrates are standing by at the waiting portion.

3. The substrate processing apparatus according to claim 1 further comprising a shock absorber preventing application of an excessive load to the substrates when the substrates are raised and brought into contact with the substrate holding device by the substrate lifter.

4. The substrate processing apparatus according to claim 3, wherein the shock absorber comprises:
   a cylinder actuator that supports the substrate supporting member of the substrate lifter, the cylinder actuator having a relief mechanism;
   a load sensor that measures a load applied to the substrates; and a controller that actuates the relief mechanism to discharge a working medium for operating the cylinder actuator from the cylinder actuator when the load measured by the load sensor exceeds a threshold.

5. The substrate processing apparatus according to claim 1, wherein the covering member is capable of moving between a first position to define the processing chamber surrounding the substrate holding device and a second position apart from the substrate holding device to expose the substrate holding device.

6. The substrate processing apparatus according to claim 1 further comprising a liquid supplying portion configured to supply a processing liquid into the processing chamber.

7. The substrate processing apparatus according to claim 6, wherein the covering member is capable of moving between a first position to define the processing chamber surrounding the substrate holding device and a second position apart from the substrate holding device to expose the substrate holding device; and the covering member is provided with a drip preventing device configured to prevent dripping of the processing liquid when the covering member is moved from the first position to the second position.

8. The substrate processing apparatus according to claim 7 further comprising a wall with which the covering member is engaged to define at least part of the processing chamber;

wherein the drip preventing device includes a processing liquid receiving element configured to receive the processing liquid, and a pressing element configured to press the processing liquid receiving element against the wall when the covering means is placed at the first position.

9. The substrate processing apparatus according to claim 1, wherein the substrate processing portion is further provided with a second covering member defining at least part of a second processing chamber in the first processing chamber defined by the first covering member, the second covering member being capable of moving between a first position to surround the substrate holding device in the first processing chamber and a second position outside the first processing chamber.

10. The substrate processing apparatus according to claim 1, wherein the substrate holding device is a rotor.

11. The substrate processing apparatus according to claim 1, wherein the substrate holding device includes:

a body;

a first holding element fixedly attached to the body; and a second holding element movably attached to the body;

wherein the second holding element is capable of moving between a first position to hold the substrates at a substrate holding area in the substrate holding device in cooperation with the first holding element, and a second position to allow the substrates to be carried into and out of the substrate holding area.

12. The substrate processing apparatus according to claim 1, wherein the substrate waiting portion is provided with a stage on which a substrate container is placed, and the stage is provided with an opening through which the substrate supporting member can vertically move.

13. The substrate processing apparatus according to claim 12, wherein the stage is capable of moving into and out of the substrate waiting portion.

14. The substrate processing apparatus according to claim 1, wherein the substrate supporting member is provided with first grooves for holding substrates before being treated and second grooves for holding substrates after being treated, the first and second grooves being arranged alternatively.

15. The substrate processing apparatus according to claim 14 further comprising a shifting device connected to the substrate supporting member for shifting the position of said first and second grooves.

16. A substrate processing apparatus comprising:

a substrate processing portion at which a plurality of substrates are treated by a process;

a substrate waiting portion at which the substrates stand by for the process, the waiting portion being arranged above the processing portion; and a substrate lifter including a substrate supporting member configured to support the substrates from below the substrates, the supporting member being capable of vertical movement, wherein the lifter supports the substrates placed at the waiting portion and lowers the substrates thereby moving the substrates from the waiting portion to the processing portion, and wherein the lifter supports the substrates placed in the processing portion and raises the substrates thereby moving the substrates from the processing portion to the waiting portion, and wherein the lifter is disposed outside of the processing portion, and wherein the substrate processing portion is provided with a substrate holding device configured to hold the substrates while the substrates are being treated and a first covering member defining at least part of a processing chamber in which the substrate holding device is disposed, and wherein the covering member is capable of moving between a first position to define the processing chamber surrounding the substrate holding device and a second position apart from the substrate holding device to expose the substrate holding device; and wherein, when the covering member is in the second position, the substrate supporting member of the substrate lifter is capable of transferring the substrate to and from the substrate holding device, and, when the covering member is in the first position, the substrate supporting member is positioned below the covering member and outside the processing chamber defined by the covering member.

17. The substrate processing apparatus according to claim 16 wherein the substrate processing portion is provided with a substrate holding device configured to hold the substrates while the substrates are being treated and a covering member defining at least part of a processing chamber in which the substrate holding device is disposed, and wherein the covering member is capable of moving between a first position to define the processing chamber surrounding the substrate holding device and a second position apart from the substrate holding device to expose the substrate holding device.

18. The substrate processing apparatus according to claim 16, wherein the substrate processing portion is further provided with a second covering member defining at least part of a second processing chamber in the first processing chamber defined by the first covering member, the second covering member being capable of moving between a first position to surround the substrate holding device in the first processing chamber and a second position outside the first processing chamber.

19. The substrate processing apparatus according to claim 16, wherein the substrate holding device is a rotor.

20. The substrate processing apparatus according to claim 16, wherein the substrate holding device includes:

a body;

a first holding element fixedly attached to the body; and a second holding element movably attached to the body;

wherein the second holding element is capable of moving between a first position to hold the substrates at a substrate holding area in the substrate holding device in cooperation with the first holding element, and a second position to allow the substrates to be carried into and out of the substrate holding area.

* * * * *